US009430875B1

(12) United States Patent
LaGace et al.

(10) Patent No.: US 9,430,875 B1
(45) Date of Patent: Aug. 30, 2016

(54) UPDATING DAMAGED-ENHANCED 3D POLYGON MESHES

(71) Applicant: CAE Inc, Saint-Laurent (CA)

(72) Inventors: Michel LaGace, Laval (CA); Patrick Piche, Laval (CA)

(73) Assignee: CAE INC., Montréal (CA)

( * ) Notice: Subject to any disclaimer, the term of this patent is extended or adjusted under 35 U.S.C. 154(b) by 6 days.

(21) Appl. No.: 14/567,313

(22) Filed: Dec. 11, 2014

Related U.S. Application Data

(63) Continuation of application No. PCT/CA2014/000716, filed on Sep. 30, 2014.

(51) Int. Cl.
| | | |
|---|---|---|
| *G06G 7/48* | (2006.01) | |
| *G06T 17/20* | (2006.01) | |
| *G06F 17/50* | (2006.01) | |
| *G06T 17/10* | (2006.01) | |

(52) U.S. Cl.
CPC ......... *G06T 17/205* (2013.01); *G06F 17/5009* (2013.01); *G06F 17/5095* (2013.01); *G06T 17/10* (2013.01)

(58) Field of Classification Search
CPC ........... G06F 17/5009; G06F 17/5095; G06T 17/10; G06T 17/205
USPC ............................................................ 703/8
See application file for complete search history.

(56) References Cited

U.S. PATENT DOCUMENTS

| | | | |
|---|---|---|---|
| 6,195,625 B1 * | 2/2001 | Day et al. .......................... 703/7 | |
| 6,254,394 B1 | 7/2001 | Draper et al. | |
| 6,417,854 B1 * | 7/2002 | Isowaki et al. ............... 345/473 | |

(Continued)

FOREIGN PATENT DOCUMENTS

| | | |
|---|---|---|
| WO | WO 2010146526 | 12/2010 |
| WO | WO 2011132205 | 10/2011 |
| WO | WO 2014086926 | 6/2014 |

OTHER PUBLICATIONS

York et al, "The DyMesh Method for Three-Dimensional Multi-Vehicle Collision Simulation", SAE Technical Paper Series 1999-01-0104, International Congress and Exposition, Mar. 1-4, 1999.*

(Continued)

*Primary Examiner* — Eunhee Kim

(74) *Attorney, Agent, or Firm* — Gowling Lafleur Henderson LLP; Benoit Yelle

(57) ABSTRACT

A method and computer system for updating damaged-enhanced polygon meshes in a computer simulation associated to a storage module accessible to at least a first and a second decentralized simulation stations and a centralized processing unit thereof. At the first station, during the computer simulation, determining coordinates of a virtual impact on a 3D polygon mesh, computing newly formed 3D polygon mesh(es) from the virtual impact without updating the storage module and rendering damaged-enhanced image(s) of the newly formed 3D polygon mesh(es) for display from a first field of view of the first station. At the second station, receiving the coordinates of the virtual impact. At the centralized processing unit, receiving the coordinates of the virtual impact, computing the newly formed 3D polygon mesh(es) from the received coordinates independently from the first station, in non-real-time priority processing and persistently updating the storage module with newly formed 3D polygon mesh(es).

18 Claims, 12 Drawing Sheets

(56) References Cited

U.S. PATENT DOCUMENTS

| | | | |
|---|---|---|---|
| 7,680,932 | B2 | 3/2010 | Defaix et al. |
| 7,803,054 | B1* | 9/2010 | Ogus et al. ............... 463/42 |
| 7,999,812 | B2* | 8/2011 | Bassett et al. ............ 345/475 |
| 8,166,565 | B1* | 4/2012 | Tormasov et al. .......... 726/27 |
| 8,405,661 | B2 | 3/2013 | Amsterdam et al. |
| 8,508,551 | B1* | 8/2013 | Van Hoff et al. .......... 345/629 |
| 8,641,526 | B1* | 2/2014 | Sitnikov ................... 463/37 |
| 8,751,204 | B2 | 6/2014 | Falash et al. |
| 2003/0177187 | A1* | 9/2003 | Levine et al. ............. 709/205 |
| 2005/0233810 | A1* | 10/2005 | Chiang ..................... 463/42 |
| 2006/0080432 | A1* | 4/2006 | Spataro et al. ............ 709/224 |
| 2007/0063999 | A1* | 3/2007 | Park ......................... 345/419 |
| 2007/0165021 | A1 | 7/2007 | Hanke |
| 2009/0248757 | A1 | 10/2009 | Havewala et al. |
| 2013/0024418 | A1 | 1/2013 | Sitrick et al. |
| 2013/0318136 | A1 | 11/2013 | Patel et al. |
| 2014/0176552 | A1 | 6/2014 | Belmans et al. |
| 2014/0267262 | A1 | 9/2014 | Masry |

OTHER PUBLICATIONS

Muller et al, "Clayworks: A System for Collaborative Real-Time Modeling and High-Performance Simulation", Proceedings of the Second IEEE International Conference on e-Science and Grid Computing, 2006.*

Knutsson et al, "Peer-to-Peer Support for Massively Multiplayer Games", IEEE INFOCOM 2004.*

Cecin et al, "P2PSE Project: Partially Decentralized Simulation for Instanced MMOGs", Technical Report, Universidade Federal do Rio Grande du Sul, 2006.*

Schilling, Anne, "Integrated 3D City Models Support Blast / Evacuation Visualization for Critical Infrastructure in Urban Environments", downloaded on Jun. 11, 2014, pp. 1-5.

Shaheed et al., "A Semantic Approach to Dynamically Constructing Behaviours in Heterogenous Virtual Environments", 2008, ISBN: 978-1-902560-19-9.

* cited by examiner

UPDATING DAMAGED-ENHANCED 3D POLYGON MESHES

CROSS REFERENCE TO RELATED APPLICATIONS

The present application is a continuation of PCT/CA2014/000716, filed Sep. 30, 2014, which claims priority from U.S. Ser. No. 14/501,157 filed on Sep. 30, 2014, each of which being incorporated herein by reference in their entirety

TECHNICAL FIELD

The present invention relates to computer generated images and, more particularly, to generating images using a computer based on a dynamically modifiable environment.

BACKGROUND

In computer simulation, an important aspect is to credibly replicate an actual environment where various dynamic events may be triggered (e.g., collision or explosion causing damages to a modeled structure, etc.). In order to remain credible, the image generation in the computer simulation has to take these events into account while maintain a rate that is high enough to be seen as fluid from the user perspective. However, a lot of material resources (e.g., processing power, memory and/storage space, etc.) is required to dynamically consider such dynamic events (for instance, especially in a multi-user environment). Consequently, it is often necessary to let go of some level of accuracy to remain within accessible material resources.

The present invention aims at improving the manner in which dynamic events are considered during a computer simulation while taking into consideration usage of the material resources.

SUMMARY

This summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A first aspect of the present invention in accordance with a first set of embodiments is directed to a method for rendering damaged-enhanced images in a computer simulation that comprises a computer generated environment. The method comprises, during the computer simulation, determining coordinates, in the computer generated environment, of a virtual impact having an effective radius and identifying, at the coordinates, a first plurality of rendering faces affected by the virtual impact considering the effective radius. The first plurality of rendering faces is associated with at least one three dimensional (3D) polygon mesh of the computer generated environment. The method then follows with clipping the first plurality of rendering faces to a mathematically-defined subtraction shape computed considering the effective radius, computing a second plurality of rendering faces from the clipped first plurality of rendering faces, thereby defining at least one newly formed 3D polygon mesh and rendering at least one damaged-enhanced image for display comprising a subset of the second plurality of rendering faces using a visual texture, the subset being determined from a field of view of the computer simulation.

The method for rendering the damaged-enhanced images may be performed at runtime by a decentralized processing unit in a limited number of milliseconds. The dedicated processing unit may be associated with a simulated vehicle of the computer generated environment and the field of view may thus be defined from a user's position within the simulated vehicle. The method may optionally further comprise, at a centralized processing unit, computing the at least one newly formed 3D polygon mesh from the determined coordinates and persistently updating a storage module associated to the simulation with the at least one newly formed 3D polygon mesh. The computing at the centralized processing unit, in this example, is performed independently from the decentralized processing unit and in non-real-time priority processing.

Computing the at least one newly formed 3D polygon mesh at the centralized processing unit may be performed using a second mathematically-defined subtraction shape more complex than the mathematically-defined subtraction shape used at the decentralized processing unit.

The method may also comprise, at a second decentralized processing unit of the computer simulation, loading the at least one newly formed 3D polygon mesh data from the storage module. The second decentralized processing unit may be associated with a second simulated vehicle of the computer generated environment having a second field of view defined from a second user's position within the second simulated vehicle. The loading may be performed when the at least one newly formed 3D polygon mesh enters the second field of view. The method may alternatively also comprise, at the second decentralized processing unit and when the second field of view comprises the 3D polygon mesh at the moment of the virtual impact, computing, in parallel to the decentralized processing unit, the at least one newly formed 3D polygon mesh from the determined coordinates.

The rendering faces may be triangles.

The method for rendering the damaged-enhanced images may further comprise, before beginning the computer simulation (e.g., at the centralized processing unit), loading the computer generated environment from a storage module and identifying one or more opened polygon meshes forming non-watertight meshes in the computer generated environment (e.g., identifying may be performed by computing one or more connectivity graphs). The method may then further comprise, for each identified opened polygon mesh, attempting to close the corresponding polygon mesh and, if not possible, marking the corresponding polygon mesh as un-damageable and, prior to identifying the first plurality of rendering faces, verifying that the at least one 3D polygon mesh is not marked as un-damageable in the database.

The method for rendering the damaged-enhanced images may also further comprise, before clipping, determining that each of the at least one 3D polygon mesh forms a watertight mesh.

The method for rendering the damaged-enhanced images may optionally comprise, after determining the coordinates, rendering at least one temporary image for display comprising a distracting visual effect at the determined coordinates at least until rendering the at least one damaged-enhanced image is performed.

The method for rendering the damaged-enhanced images may further comprise, after identifying the affected first plurality of rendering triangles, buffering the first plurality of rendering triangles thereby allowing undoing the clipping.

The mathematically-defined subtraction shape is a sphere or a spheroid expressed by a single mathematical formula.

The method for rendering the damaged-enhanced images may also further comprise, after computing the second plurality of rendering faces, testing the at least one newly formed 3D polygon mesh for loops.

Rendering the second plurality of rendering faces may further comprise applying a damage texture, fading outwardly from the coordinates and exceeding the effective radius, on a subset of the second plurality of rendering faces corresponding to surfaces previously represented in at least the first plurality of rendering faces.

A second aspect of the present invention in accordance with a first set of embodiments is directed a computer system for rendering damaged-enhanced images in a computer simulation comprising a computer generated environment, The computer system comprises a processor module for, i. during the computer simulation, determining coordinates, in the computer generated environment, of a virtual impact having an effective radius and ii. identifying, at the coordinates, a first plurality of rendering faces affected by the virtual impact considering the effective radius. The first plurality of rendering faces is associated with at least one three dimensional (3D) polygon mesh of the computer generated environment. The processor module is also for iii. clipping the first plurality of rendering faces to a mathematically-defined subtraction shape computed considering the effective radius and iv. computing a second plurality of rendering faces from the clipped first plurality of rendering faces, thereby defining at least one newly formed 3D polygon mesh. The processor module also comprises an image generator module for rendering at least one damaged-enhanced image for display comprising a subset of the second plurality of rendering faces using a visual texture, the subset being determined from a field of view of the computer simulation.

The processor module may comprise a decentralized processing unit associated with a simulated vehicle of the computer generated environment and the field of view may be defined from a user's position within the simulated vehicle, the decentralized processing unit performing i. to iv.

A centralized processing unit (e.g., of the processor module or of another computer system) may further be for computing the at least one newly formed 3D polygon mesh from the determined coordinates and storing the computed at least one newly formed 3D polygon mesh in a storage module (e.g., the storage module being associated with the computer simulation, comprised in the computer system or connected to the computer system). Computing at the centralized processing is performed independently from to the decentralized processing unit and in non-real-time priority processing.

The centralized processing unit may compute the at least one newly formed 3D polygon mesh using a second mathematically-defined subtraction shape more complex than the mathematically-defined subtraction shape used at the decentralized processing unit.

A second decentralized processing unit of the computer simulation (e.g., in the computer system or in network communication with the computer system) may load the at least one newly formed 3D polygon mesh data from the storage module. The second decentralized processing unit may be associated with a second simulated vehicle of the computer generated environment having a second field of view defined from a second user's position within the second simulated vehicle. The loading may be performed when the at least one newly formed 3D polygon mesh enters the second field of view. The second decentralized processing unit, when the second field of view comprises the 3D polygon mesh at the moment of the virtual impact, may also compute, in parallel to the decentralized processing unit, the at least one newly formed 3D polygon mesh from the determined coordinates.

The rendering faces are triangles.

The processor module may also further be for, before beginning the computer simulation, loading the computer generated environment from a memory module (e.g., at the decentralized processing unit or at the centralized processing unit) and for identifying one or more opened polygon meshes forming non-watertight meshes in the computer generated environment. The processor module may perform the identifying by computing connectivity graphs.

The processor module may further be for, for each identified opened polygon mesh, attempting to close the corresponding polygon mesh and, if not possible, marking the corresponding polygon mesh as un-damageable in the storage module and, prior to identifying the first plurality of rendering faces, verifying that the at least one 3D polygon mesh is not marked as un-damageable in the storage module.

The processor module may further be for, before clipping, determining that each of the at least one 3D polygon mesh forms a watertight mesh.

The image generator module may further be for, after determination of the coordinates by the processor module, rendering at least one temporary image for display comprising a distracting visual effect at the determined coordinates at least until rendering the at least one damaged-enhanced image is performed.

The processor module may further be for, after identifying the affected first plurality of rendering triangles, buffering the first plurality of rendering triangles thereby allowing undoing the clipping.

The mathematically-defined subtraction shape may be a sphere or a spheroid expressed by a single mathematical formula.

The processor module may further be for, after computing the second plurality of rendering faces, testing the at least one newly formed 3D polygon mesh for loops.

The image generator module may render the second plurality of rendering faces by further applying a damage texture, fading outwardly from the coordinates and exceeding the effective radius, on a subset of the second plurality of rendering faces corresponding to surfaces previously represented in at least the first plurality of rendering faces.

A first aspect of the present invention in accordance with a second set of embodiments is directed a method for rendering plausible images of a three-dimensional (3D) polygon mesh in a computer simulation comprising a computer generated environment. The method comprises, on the 3D polygon mesh defined using a plurality of vertices providing a plurality of rendering faces, determining an anchor point from at least three of the plurality of vertices and, for each one of the rendering faces of the 3D polygon mesh, determining whether a path exists towards the anchor point and, when the path does not exist, removing the one rendering face from the 3D polygon mesh into an updated 3D polygon mesh. the method then follows with rendering the updated 3D polygon mesh for display comprising a subset of the plurality of rendering faces using a visual texture, the subset being determined from a field of view of the computer simulation.

Optionally, the method for rendering the plausible images may further comprise computing a connectivity graph representing the 3D polygon mesh from the plurality of rendering faces. In this example, when the path does not exist towards the anchor point, removing the one rendering face is performed by removing the one rendering face from the connectivity graph into an updated connectivity graph representing the updated 3D polygon mesh.

The method for rendering the plausible images may be performed at runtime by a decentralized processing unit in a limited number of milliseconds, the dedicated processing unit being associated with a simulated vehicle of the computer generated environment, wherein the field of view is defined from a user's position within the simulated vehicle. The dedicated processing unit may be associated to the simulated vehicle as a part of a training device comprising at least one display screen positioned considering the user's position and at least one simulated instrument of the simulated vehicle.

The method for rendering plausible images may further comprise, before determining whether the path exists towards the anchor point and following a virtual impact on the 3D polygon mesh affecting at least one impacted rendering face from the plurality of rendering faces, replacing, at runtime, the at least one impacted rendering face with a plurality of new rendering faces.

The method for rendering plausible images may also further comprise, before rendering the updated 3D polygon mesh, at runtime, determining a center of mass of a part the updated 3D polygon mesh from a plurality of vertices associated with the part; at runtime, determining that the part of the 3D polygon mesh is unstable from the perspective of the anchor point considering a virtual gravity force applied in the simulation; at runtime, identifying a subset of unstable rendering faces from the plurality of rendering faces on the unstable part and, at runtime, removing the unstable rendering faces from the updated 3D polygon mesh. In this example, identifying the unstable rendering faces may further comprises appending new rendering faces to close the updated 3D polygon mesh. The updated 3D polygon mesh may have an associated virtual tensile strength and a virtual density value and removing the unstable rendering faces may further be performed only when a virtual collapsing pressure, computed from the virtual density value for a fulcrum area of the unstable part compared to the center of mass, exceeds the virtual tensile strength. Determining that the part is unstable may be performed by locating a narrow link surrounding the virtual impact on the updated 3D polygon mesh, the narrow link defining a fulcrum area between the part and a second part of the updated 3D polygon mesh connected to the anchor point and determining that the part is unstable when the structure above the narrow link is not connected to the anchor point and the center of mass is not above the fulcrum area. Locating the narrow link in the updated 3D polygon mesh may be performed by identifying, surrounding the virtual impact, a lowest isolated vertex from the plurality vertices and, until the narrow link is located or until a performance-based threshold is reached, determining the narrow link as the minimum fulcrum area between the part and the second part connected to the anchor point starting from a horizontal plane at the lowest isolated vertex and considering the closest neighbor vertices thereof.

The method for rendering the plausible images may further comprise, at a centralized processing unit, removing the one rendering face into the updated 3D polygon mesh independently from the decentralized processing unit and in non-real-time priority processing.

A second aspect of the present invention in accordance with a second set of embodiments is directed to a method for rendering plausible images of a three-dimensional (3D) polygon mesh in a computer simulation comprising, on the 3D polygon mesh defined using a plurality of vertices providing a plurality of rendering faces, determining an anchor point from at least three of the plurality of vertices, at runtime, determining a center of mass of a part the 3D polygon mesh from the plurality of vertices associated with the part and, at runtime, determining that the part of the 3D polygon mesh is unstable from the perspective of the anchor point considering a virtual gravity force applied in the simulation. The method may also comprise, at runtime, removing a subset of unstable rendering faces from the plurality of rendering faces on the unstable part into an updated 3D polygon mesh and rendering the updated 3D polygon mesh for display comprising a subset of the plurality of rendering faces using a visual texture, the subset being determined from a field of view of the computer simulation.

Determining that the part is unstable may be performed by locating a narrow link surrounding a virtual impact affecting at least one impacted rendering face from the plurality of rendering faces on the 3D polygon mesh, the narrow link defining a fulcrum area between the part and a second part of the 3D polygon mesh connected to the anchor point and determining that the part is unstable when the structure above the narrow link is not connected to the anchor point and the center of mass is not above the fulcrum area. The method may also comprise, following a virtual impact on the 3D polygon mesh affecting at least one impacted rendering face from the plurality of rendering faces, replacing, at runtime, the at least one impacted rendering face with a plurality of new rendering faces. Locating the narrow link in the 3D polygon mesh may be performed by identifying, surrounding the virtual impact, a lowest isolated vertex from the plurality vertices and, until the narrow link is located or until a performance-based threshold is reached, determining the narrow link as the minimum fulcrum area between the part and the second part connected to the anchor point starting from a horizontal plane at the lowest isolated vertex and considering the closest neighbor vertices thereof.

The method for rendering the plausible images may further comprise, at a centralized processing unit, removing the one rendering face from the 3D polygon mesh independently from the decentralized processing unit and in non-real-time priority processing.

A third aspect of the present invention in accordance with a second set of embodiments is directed a computer system for rendering plausible images of a three-dimensional (3D) polygon mesh in a computer simulation. The computer system comprises a memory module and a processor module. the memory module is for storing respective representations of a plurality of 3D polygon meshes of the computer simulation, the plurality of 3D polygon meshes being determined from at least a field of view of the computer simulation. The processor module is for, on a 3D polygon mesh, of the plurality of 3D polygon meshes, defined using a plurality of vertices providing a plurality of rendering faces, determining an anchor point from at least three of the plurality of vertices and, for each one of the rendering faces of the 3D polygon mesh, determining whether a path exists towards the anchor point and, when the path does not exist, removing the one rendering face from the 3D polygon mesh into an updated 3D polygon mesh. The processor module is also for storing a representation of the updated 3D polygon mesh into the memory module. The processor module comprises an image generator module for rendering the updated 3D polygon mesh for display comprising a subset of the plurality of rendering faces using a visual texture, the subset being determined from the field of view of the computer simulation.

The processor module may further be for computing a connectivity graph from the plurality of rendering faces as the representation of the 3D polygon mesh. in this example, when the path does not exist towards the anchor point, the processor module removes the one rendering face by removing the one rendering face from the connectivity graph into an updated connectivity graph representing the updated 3D polygon mesh.

The processor module may also comprise a decentralized processing unit associated with a simulated vehicle of the computer generated environment, wherein the field of view is defined from a user's position within the simulated vehicle. A first training device may be associated with the decentralized processing unit, the first training device comprising at least one display screen positioned considering the user's position and at least one simulated instrument of the simulated vehicle.

The processor module may further, before determining whether the path exists towards the anchor point and following a virtual impact on the 3D polygon mesh affecting at least one impacted rendering face from the plurality of rendering faces, replace, at runtime, the at least one impacted rendering face with a plurality of new rendering faces.

The processor module may also, before rendering the updated 3D polygon mesh, at runtime, determine a center of mass of a part of the updated 3D polygon mesh from a plurality of vertices associated with the part; at runtime, determine that the part of the updated 3D polygon mesh is unstable from the perspective of the anchor point considering a virtual gravity force applied in the simulation; at runtime, identify a subset of unstable rendering faces from the plurality of rendering faces on the unstable part and, at runtime, remove the unstable rendering faces from the updated 3D polygon mesh.

The processor module, when identifying the unstable rendering faces, may further append new rendering faces to the updated connectivity graph to close the updated 3D polygon mesh.

The updated 3D polygon mesh may have an associated virtual tensile strength and a virtual density value and the processor module may further remove the unstable rendering faces only when a virtual collapsing pressure, computed from the virtual density value for a fulcrum area of the unstable part compared to the center of mass, exceeds the virtual tensile strength.

The processor module may determine that the part is unstable by locating a narrow link surrounding the virtual impact on the updated 3D polygon mesh, the narrow link defining a fulcrum area between the part and a second part of the updated 3D polygon mesh connected to the anchor point and determining that the part is unstable when the structure above the narrow link is not connected to the anchor point and the center of mass is not above the fulcrum area.

The processor module may locate the narrow link in the 3D polygon mesh by identifying, surrounding the virtual impact, a lowest isolated vertex from the plurality vertices and, until the narrow link is located or until a performance-based threshold is reached, determine the narrow link as the minimum fulcrum area between the part and the second part connected to the anchor point starting from a horizontal plane at the lowest isolated vertex and considering the closest neighbor vertices thereof.

A centralized processing unit of the computer system may further remove the one rendering face into the updated 3D polygon mesh independently from the decentralized processing unit and in non-real-time priority processing.

A fourth aspect of the present invention in accordance with a second set of embodiments is directed a computer system for rendering plausible images of a three-dimensional (3D) polygon mesh in a computer simulation comprising a memory module and a processor module. The memory module is for storing respective representations of a plurality of 3D polygon meshes of the computer simulation. The processor module is for, on the 3D polygon mesh, of the plurality of 3D polygon meshes, defined using a plurality of vertices providing a plurality of rendering faces, determining an anchor point from at least three of the plurality of vertices. The processor module is further for, at runtime, determining a center of mass of a part the 3D polygon mesh from the plurality of vertices associated with the part; at runtime, determining that the part of the 3D polygon mesh is unstable from the perspective of the anchor point considering a virtual gravity force applied in the simulation and at runtime, removing a subset of unstable rendering faces from the plurality of rendering faces on the unstable part into an updated 3D polygon mesh. The processor module further comprises an image generator module for rendering the updated 3D polygon mesh for display comprising a subset of the plurality of rendering faces using a visual texture, the subset being determined from a field of view of the computer simulation.

The processor module may determine that the part is unstable is by locating a narrow link surrounding a virtual impact affecting at least one impacted rendering face from the plurality of rendering faces on the 3D polygon mesh, the narrow link defining a fulcrum area between the part and a second part of the 3D polygon mesh connected to the anchor point and determining that the part is unstable when the structure above the narrow link is not connected to the anchor point and the center of mass is not above the fulcrum area.

The processor module may further be for, following a virtual impact on the 3D polygon mesh affecting at least one impacted rendering face from the plurality of rendering faces, replacing, at runtime, the at least one impacted rendering face with a plurality of new rendering faces. Locating the narrow link in the 3D polygon mesh may be performed by identifying, surrounding the virtual impact, a lowest isolated vertex from the plurality vertices and, until the narrow link is located or until a performance-based threshold is reached, determining the narrow link as the minimum fulcrum area between the part and the second part connected to the anchor point starting from a horizontal plane at the lowest isolated vertex and considering the closest neighbor vertices thereof.

A centralized processing unit of the computer system may further remove the one rendering face from the 3D polygon mesh independently from the decentralized processing unit and in non-real-time priority processing.

A first aspect of the present invention in accordance with a third set of embodiments is directed a method for updating damaged-enhanced three dimensional (3D) polygon meshes in a computer simulation associated to a storage module accessible to at least a first decentralized simulation station, a second decentralized simulation station and a centralized processing unit thereof. The computer simulation comprises a computer generated environment. The method comprises, at the first decentralized simulation station, during the computer simulation, determining coordinates of a virtual impact on a 3D polygon mesh of the computer generated environment and, at runtime, computing at least one newly formed 3D polygon mesh from the virtual impact before rendering at least one damaged-enhanced image of the at least one newly formed 3D polygon mesh for display from a first field of view of the first decentralized simulation station. The method also comprises, at the second decentralized simulation station, receiving the coordinates of the virtual impact. The method also comprises, at the centralized processing unit, receiving the coordinates of the virtual impact, computing the at least one newly formed 3D polygon mesh from the received coordinates and persistently updating the storage module associated to the simulation with the at least one newly formed 3D polygon mesh. The computing at the centralized processing unit is performed independently from the first decentralized simulation station, in non-real-time priority processing.

Computing the at least one newly formed 3D polygon mesh from the virtual impact at the first decentralized simulation station and at runtime may be performed without updating the storage module.

The first decentralized simulation station may be associated to a first simulated vehicle of the computer generated environment and the second decentralized simulation station may be associated to a second simulated vehicle of the computer generated environment. In this example, the first field of view of the first decentralized simulation station is defined from a user's position within the first simulated vehicle and a second field of view of the second decentralized simulation station is defined from a user's position within the second simulated vehicle.

The method for updating damaged-enhanced 3D polygon meshes may further comprise, from the second decentralized simulation station of the computer simulation, loading the at least one newly formed 3D polygon mesh from the storage module when the at least one newly formed 3D polygon mesh enters the second field of view of the second decentralized simulation station.

Alternatively, the method for updating damaged-enhanced 3D polygon meshes may further comprise, at the second decentralized simulation station and upon receiving the coordinates of the virtual impact, computing the at least one newly formed 3D polygon mesh from the received coordinates. In this example, the computing at the second decentralized simulation station is performed at runtime independently (e.g., and in parallel) from the first decentralized simulation station.

Computing the at least one newly formed 3D polygon mesh at the centralized processing unit may be performed using a second mathematically-defined subtraction shape more complex than the mathematically-defined subtraction shape used at the decentralized simulation station(s).

The method for updating damaged-enhanced 3D polygon meshes may further comprise, at the first decentralized simulation station, loading the at least one newly formed 3D polygon mesh from the storage module when the at least one newly formed 3D polygon mesh reenters the first field of view.

The updating may performed by storing at least one new file in a file system of the storage module corresponding to the at least one newly formed 3D polygon mesh and storing at least one event in a database of the storage module corresponding completion of the computation of the at least one newly formed 3D polygon mesh.

The storage module may comprise a file system and computing at the centralized processing unit may further comprise locating a latest version of a content file in the file system that corresponds to the 3D polygon mesh and verifying if at least one transaction marker file associated with the content file exists, the at least one transaction marker file indicating if the content file is currently subject to an ongoing transaction. When the content file is not currently subject to an ongoing transaction, the method then comprises copying the content file into a new content file on the file system, updating the new content file with the at least one newly formed 3D polygon mesh, a name of the new content file reflecting a newer version compared to the latest version and updating the at least one transaction marker file.

When the content file is currently subject to an ongoing transaction, the method may further comprise waiting until the at least one transaction marker file indicates completion of the ongoing transaction, creating a new start transaction marker file, a name of the new start transaction marker file reflecting a newer version compared to the name of the content file following the ongoing transaction, updating the new content file with the at least one newly formed 3D polygon mesh, the name of the new content file reflecting the same version as the start transaction file and creating a new end transaction marker file, a name of the end transaction marker file reflecting the same version as the start transaction marker file.

The storage module may comprise a file system and the method may further comprise, after receiving the coordinates of the virtual impact at the centralized processing unit and before updating from the centralized processing unit, receiving coordinates of a second virtual impact on the 3D polygon mesh at the centralized processing unit, locating a latest version of a content file in the file system that corresponds to the 3D polygon mesh, creating a first start transaction marker file, a name of the first start transaction marker file reflecting a first new version compared to the latest version, creating a first new content file with the at least one newly formed 3D polygon mesh computed from the virtual impact, the name of the first new content file reflecting the first new version, creating a first end transaction marker file, a name of the first end transaction marker file reflecting the same version as the first start transaction marker file, creating a second start transaction marker file, a name of the second start transaction marker file reflecting a second new version compared to the first new version, creating a second new content file with the at least one newly formed 3D polygon mesh computed from the second virtual impact, the name of the second new content file reflecting the second new version and creating a second end transaction marker file, a name of the second end transaction marker file reflecting the same version as the second start transaction marker file.

A second aspect of the present invention in accordance with a third set of embodiments is directed a system for updating damaged-enhanced three dimensional (3D) polygon meshes in a computer simulation comprising a computer generated environment. The computer system comprises a storage module associated with the computer simulation comprising a computer generated environment, a first decentralized simulation station, a second decentralized simulation station and a centralized processing unit.

The first decentralized simulation station is for, during the computer simulation, determining coordinates of a virtual impact on a 3D polygon mesh of the computer generated environment and, at runtime, computing at least one newly formed 3D polygon mesh from the virtual impact before rendering at least one damaged-enhanced image of the at least one newly formed 3D polygon mesh for display from a field of view of the first decentralized simulation station.

The second decentralized simulation station is for receiving the coordinates of the virtual impact.

The centralized processing unit is for receiving the coordinates of the virtual, computing the at least one newly formed 3D polygon mesh from the determined coordinates, wherein computing at the centralized processing unit is performed independently from the first decentralized simulation station, in non-real-time priority processing and persistently updating the storage module associated to the simulation with the at least one newly formed 3D polygon mesh.

The first decentralized simulation station may compute the at least one newly formed 3D polygon mesh from the virtual impact at and at runtime without updating the storage module.

The first decentralized simulation station may be associated to a first simulated vehicle of the computer generated environment and the first field of view of the first decentralized simulation station may thus be defined from a user's position within the first simulated vehicle. The second decentralized simulation station may be associated to a second simulated vehicle of the computer generated environment and a second field of view of the second decentralized simulation station may thus be defined from a user's position within the second simulated vehicle.

The second decentralized simulation station may further load the at least one newly formed 3D polygon mesh from the storage module when the at least one newly formed 3D polygon mesh enters the second field of view of the second decentralized simulation station.

Alternatively, the second decentralized simulation station may further, upon receiving the coordinates of the virtual impact, compute the at least one newly formed 3D polygon mesh from the received coordinates. In this example, the computing at the second decentralized simulation station is performed at runtime independently (e.g., in parallel) from the first decentralized simulation station.

Computing the at least one newly formed 3D polygon mesh at the centralized processing unit may be performed using a second mathematically-defined subtraction shape more complex than the mathematically-defined subtraction shape used at the decentralized processing unit.

The first decentralized simulation station may further load the at least one newly formed 3D polygon mesh from the storage module when the at least one newly formed 3D polygon mesh reenters the first field of view.

The centralized processing unit may performs updating by storing at least one new file in a file system of the storage module corresponding to the at least one newly formed 3D polygon mesh and storing at least one event in a database of the storage module corresponding completion of the computation of the at least one newly formed 3D polygon mesh.

The storage module may comprise a file system and the centralized processing unit may perform the computing by further locating a latest version of a content file in the file system that corresponds to the 3D polygon mesh and verifying if at least one transaction marker file associated with the content file exists, the at least one transaction marker indicating if the content file is currently subject to an ongoing transaction. When the content file is not currently subject to an ongoing transaction, the centralized processing unit may further copy the content file into a new content file on the file system, update the new content file with the at least one newly formed 3D polygon mesh, a name the new content file reflecting a newer version compared to the latest version and update the at least one transaction marker file.

When the content file is currently subject to an ongoing transaction, the centralized processing unit may further for wait until the at least one transaction marker file indicates completion of the ongoing transaction, create a new start transaction marker file, a name of the new start transaction marker file reflecting a newer version compared to the name of the content file following the ongoing transaction, update the new content file with the at least one newly formed 3D polygon mesh, the name of the new content file reflecting the same version as the start transaction file and create a new end transaction marker file, a name of the end transaction marker file reflecting the same version as the start transaction marker file.

The storage module may comprise a file system and the centralized processing unit may further, after receiving the coordinates of the virtual impact and before updating, receive coordinates of a second virtual impact on the 3D polygon mesh, locate a latest version of a content file in the file system that corresponds to the 3D polygon mesh, create a first start transaction marker file, a name of the first start transaction marker file reflecting a first new version compared to the latest version, create a first new content file with the at least one newly formed 3D polygon mesh computed from the virtual impact, the name the first new content file reflecting the first new version, create a first end transaction marker file, a name of the first end transaction marker file reflecting the same version as the first start transaction marker file, create a second start transaction marker file, a name of the second start transaction marker file reflecting a second new version compared to the first new version, create a second new content file with the at least one newly formed 3D polygon mesh computed from the second virtual impact, the name the second new content file reflecting the second new version and create a second end transaction marker file, a name of the second end transaction marker file reflecting the same version as the second start transaction marker file.

BRIEF DESCRIPTION OF THE DRAWINGS

Further features and exemplary advantages of the present invention will become apparent from the following detailed description, taken in conjunction with the appended drawings, in which.

DETAILED DESCRIPTION

Figure 1:
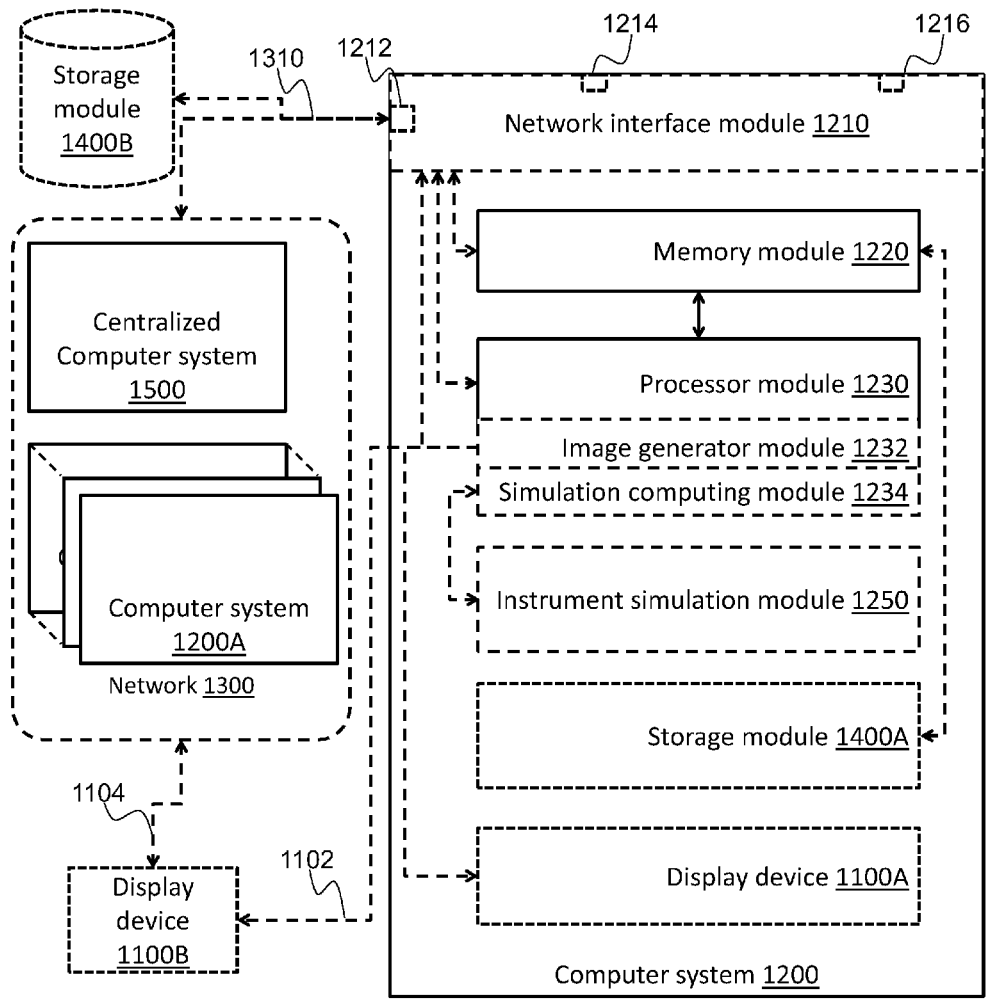
FIG. 1 is a logical representation of an exemplary computer system in accordance with the teachings of the present invention.

Reference is now made to the drawings in which FIG. 1 shows a logical representation of an exemplary computer system 1200 in accordance with the teachings of the present invention. FIG. 1 also shows a logical representation of an optional network 1300 an additional computer systems 1200A . . . G and a centralized computer system 1500 that may be used in certain embodiments of the present invention. The computer system 1200 comprises a processor module 1230 and a memory module 1220. A display device is provided with the computer system (1100A) and/or in communication with the computer system (1100B, both solutions being referred to as 1100). In the example of FIG. 1, the display device 1100B may be in communication with the computer system 1200 via a dedicated port as exemplified via a logical link 1102 or through the network 1300 as exemplified via a logical link 1104. The display device 1100 may comprise at least one physical display unit, and may also comprise many display units of one or more technologies (e.g., Cathode Ray Tube (CRT), Liquid Crystal Display (LCD) screen or projector, any means to project the image onto a screen, mirror and/or display surface, etc.). A storage module may be provided with the computer system 1400A and/or in communication with the computer system 1400B (both solutions being referred to in the description as 1400). The storage devices module 1400A and/or 1400B may represent one or more logical or physical as well as local or remote hard disk drive (HDD) (or an array thereof). The storage devices module 1400 may further represent a local or remote database made accessible to the computer system 1200 by a standardized or proprietary interface. The computer system 1200 may, in certain embodiments, comprise a network interface module 1210 and an instrument simulation module 1250. The processor module may further comprise, or may be seen logically as comprising, an image generator module 1232 and a simulation computing module 1234. The image generator module 1232 may also comprise one or more dedicated graphical processing units (not shown).

The network interface module 1210, e.g., through one or more of its interfaces (e.g., 1212, 1214, 1216), may be used in the context of the present invention to communicate with one or more of the other computer systems 1200A . . . G, the centralized computer system 1500, the display device 1100B (e.g., display data over Ethernet) and/or the storage module 1400B (e.g., to store and/or load a model of a computer simulation). The communication via the network interface module 1210 may be performed through the network 1300 via additional network nodes (e.g., one ore more network hub, network switch, network router, firewall, etc.) or directly (e.g., node-to-node cable(s)). The one or more interfaces may use different protocols and physical medium (e.g., local area network (LAN) over twisted pair cables, wireless LAN, wide area network (WAN) over cable, optical fiber, cellular, etc.), metropolitan area network MAN), etc.).

The computer system 1200 may be used as a simulation station (e.g., training device) for a computer simulation comprising a computer generated environment. The computer system 1200 may be used as a standalone simulation system. The computer system 1200 may also be used together with the centralized computer system 1500 to provide the computer simulation. For instance, the centralized computer system 1500 may be referred to as the simulation engine and may provide general simulation management of the computer simulation while the computer system 1200 may be decentralized from the centralized computer system 1500 and may provide user-specific simulation management. Examples of simulation management of the computer simulation include processing simulation-wide events, offline processing of simulation events, pre-processing of the computer generated environment, etc. Examples of user-specific simulation management include image generation considering a field of view/user' position (e.g., using one or more image generator module 1232), runtime processing of simulation events using the simulation computing module 1234 (e.g., events within the filed of view), processing inputs from simulated instrument(s), providing feedback through simulated instrument(s) and/or feedback devices (vibration of an instrument, physical movement of the user and/or the whole system, etc.) using the simulation computing module 1234 and the instrument simulation module 1250.

In exemplary embodiments where the computer simulation involves at least the computer system 1200 and the centralized computer system 1500, communications therebetween may be handled in different manner depending on different architecture choices. For instance, the systems 1200 and 1500 may be logically distinct using distributed processing within a single computer system (e.g., virtual machines of a single compute system, independent threads of a single computer program executing on a single compute system). The communication may thus remain internal to the single computer. In most embodiments, however, the systems 1200 and 1500 are logically distinct using distributed processing on at least two computer systems (e.g. on different systems having their own dedicated processor(s)). The communication may thus typically be inter-system.

In exemplary embodiments where the computer simulation involves the centralized computer system 1500 and the computer system 1200 (and possibly additional computer system(s) 1200A . . . G), a simulation network (e.g., overlaid on the network 1300) may be used, at runtime, to exchange information (e.g., event-related simulation information). For instance, movements of a vehicle associated to the computer system 1200 and events related to interactions of the computer system 1200 with the computer generated environment may be shared through the simulation network from the computer system 1200. Likewise, simulation-wide events (e.g., related to persistent modifications to the computer generated environment, modified simulated weather, etc.) may be shared through the simulation network from the centralized computer system 1500. In addition, the storage module 1400 (e.g., a networked database system) accessible to all computer systems involved in the computer simulation may be used to store data necessary for rendering computer generated environment (e.g., data each of the 3D polygon meshes of the computer generated environment, etc.). In some embodiments, the storage module 1400 is only updated from the centralized computer system 1500 and the computer system(s) 1200, 12000A . . . G only load data from the storage module 1400.

In a first set of exemplary embodiments, the present invention aims at improving the manner in which dynamic events are considered during a computer simulation while taking into consideration expected plausibility and usage of the material resources. An example of dynamic events in the computer simulation is an explosion, an impact (e.g., from an inert projectile) or an explosive impact (e.g., from a rocket or a missile) at a given location within a computer generated environment of the computer simulation. Such dynamic events may create damage to structures represented in the computer simulation. The damage should be made visible (e.g., rendered on display) to the initiating user of the dynamic event. In some embodiments, the damage is made persistent in a centralized simulation engine of the computer simulation and may also be made visible to other parties of the computer simulation (if any), decentralized from the centralized simulation engine. In the first set of exemplary embodiments, the present invention is meant to support rendering of aesthetically attractive images that are, if not realist, at least plausibly representing damages that may be caused by the dynamic event. Of course, skilled person will readily understand that the rendered images being aesthetical and attractive is subjective and depends on the quality of artistic work performed to create the necessary visual texture(s). The present invention, while it supports appropriate rendering of the visual texture, is not meant to improve poor artistic work.

In a second set of exemplary embodiments, the present invention aims at improving the manner in which 3D polygon meshes are represented during a computer simulation while taking into consideration expected plausibility and usage of the material resources. For instance, one or more 3D polygon meshes may present an unrealistic shape (e.g., disconnected part or unbalanced shape that should collapse, etc.). Based on a logical representation (e.g., connectivity graph) of the polygon mesh built considering an anchor point (e.g., connection of the 3D mesh in its environment such as the simulated ground), some rendering faces of the polygon mesh are removed (e.g., disappear or collapse from the perspective of the user). For instance, disconnected part may be identified as being disconnected from the anchored portion of the polygon mesh while unbalanced shape may be identified based on the center of mass and a located short link between the unbalanced shape and the rest of the polygon mesh. The disappearance and/or collapsing may be performed upon loading the polygon mesh(es), e.g., to ensure that the simulation shows credible structure to start with. The disappearance and/or collapsing may also be performed in conjunction with dynamic events in the computer simulation (e.g., as previously described in the first set of embodiments). The unrealistic shape may disappear from the simulation or may be transformed into debris (e.g., smoke or other effect covering disappearance, animation from the shape to debris, animation of a falling structure and/or, instant transformation of the shape into debris (e.g., covered by smoke or other effect), etc.)

In a third set of embodiments, the present invention aims at improving the manner in which dynamic events are shared during a computer simulation between at least two computer simulation stations and a centralized processing unit (e.g., central simulation engine unit). A dynamic event on a polygon mesh is treated by a first computer simulation station into one or more newly formed 3D polygon meshes. The same dynamic event on the same polygon mesh is also treated by a centralized processing unit independently from the first computer simulation station (e.g., in parallel and/or in non-real-time processing) into the newly formed 3D polygon mesh(es). The non-real time processing by the centralized processing unit may involve exactly the same mathematical operation(s) as treatment by the first computer situation system, but may also involve at least one more complex operation leading to even more realistic newly formed 3D polygon mesh(es). The centralized processing unit then persistently updates the newly formed 3D polygon mesh(es) into the storage module 1400 accessible to all involved decentralized simulation stations. In some embodiments, when a second dynamic event occurs on the polygon mesh and/or newly formed 3D polygon mesh(es) (e.g., from the second computer simulation station), the centralized processing unit may use versioning of individual files representing the different involved polygon meshes to ensure proper completion of the operations (e.g., using transaction marker files).

Skilled persons will readily understand that a partial or complete set of features from the first, the second and the third set of embodiments may be implemented together.

For instance, in some embodiments, once a dynamic event is treated and the damage-enhanced images are rendered, the ensuing 3D polygon meshes are persistently stored from a centralized unit or simulation engine and the different simulation station (or training devices) may then plausibly interact with the ensuing 3D polygon meshes. For example, a damaged fence shall have some or all of its geometry removed to allow a tank to pass through.

While it is an objective for the damage-enhanced images to be rendered at least at runtime (i.e., as seamless as possible or seen as quasi-instantaneous from the perspective of the user), in some embodiments, additional special effects may be used during a certain time at least until the damage-enhanced images are rendered (e.g., animated explosion and dust). The special effects shall be provided with low latency (e.g., in the order of a few hundred milliseconds) to make the effect plausible.

In the context of the present invention, runtime execution corresponds to operations executed during the computer simulation that may have an impact on the perceived quality of the computer simulation from a user perspective. An operation performed at runtime thus typically needs to meet certain performance constraints that may be expressed, for instance, in terms of maximum time, maximum number of frames, and/or maximum number of processing cycles. For instance, in a simulation having a frame rate of 60 frames per second, it is expected that a modification performed within 5 to 10 frames will appear seamless to the user.

In some embodiments, it is possible to undo the damages related to one or more dynamic events.

The computer simulation may, for instance, be used for training purposes and/or for enacting a scenario from historical data (e.g. from an event recording device (e.g., black box) from an aircraft, a train, etc.). The computer simulation may be scenario-based (e.g., where simulation code driving the computer generated environment comprises one or more predetermined events, motions, sounds, etc.).

The computer simulation may be a vehicle computer simulation (e.g., single or multiple vehicles simultaneously) and a field of view for rendering the image(s) may be defined from a user's position within a simulated vehicle (e.g., different field of view for different simulated vehicles). The present invention is not limited by the type of simulated vehicle, which may be terrestrial (car, tank, etc.), underground, airborne (e.g., an aircraft, a space shuttle), floating (e.g., a boat), etc. The field of view, or point of view, may be defined from the position of a trainee of the simulated vehicle (e.g., interacting with the simulation) and/or the position of an operator of the simulated vehicle (e.g., only determining content of the simulation code or participating to the simulation as well).

The computer generated environment comprises at least one three dimensional (3D) polygon mesh. Typically, a plurality of 3D polygon meshes are presented in the computer generated environment. Interactions are expected in the computer simulation between the polygon mesh(es) and the simulated vehicle(s) as well as between the polygon mesh(es) and dynamic events, e.g., triggering damages thereto. The dynamic events are typically initiated from the user(s) of the computer simulation.

Figure 2:
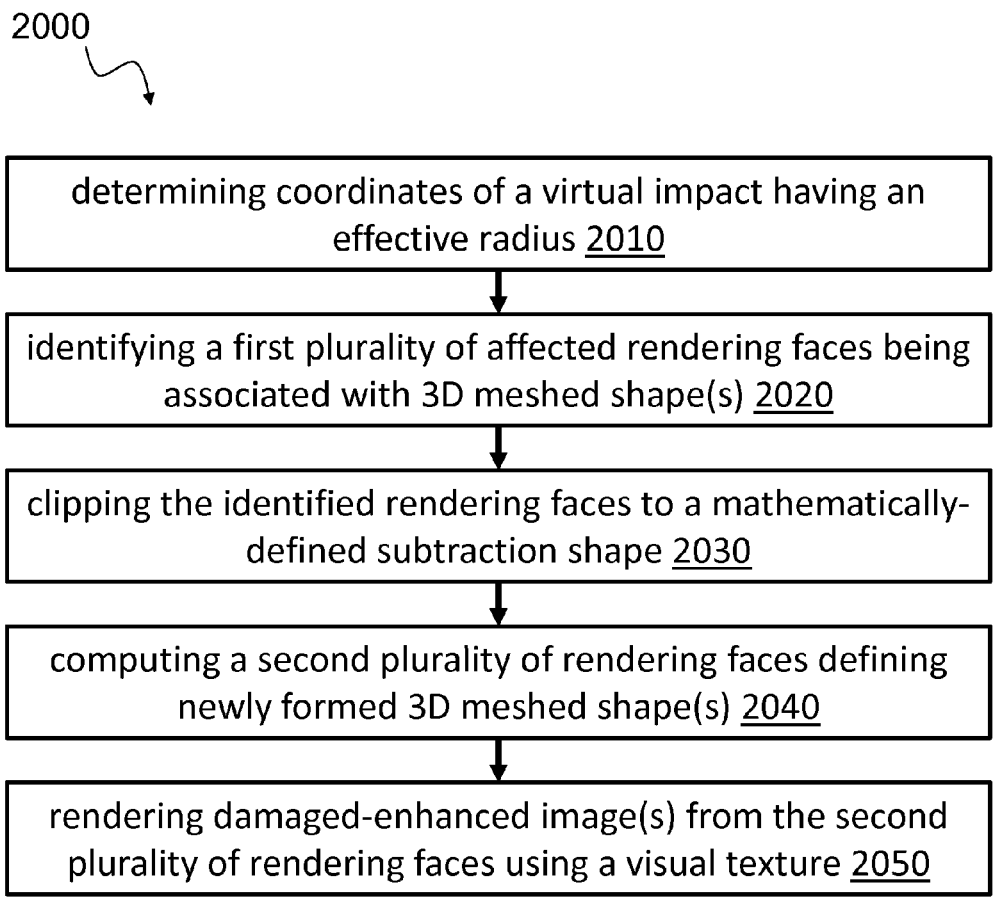
FIG. 2 is a flow chart of a first exemplary rendering method in accordance with a first set of embodiments of the present invention.

FIG. 2 illustrates an exemplary method 2000 for rendering damaged-enhanced images in the computer simulation in accordance with a first set of embodiments. The computer simulation comprises a computer generated environment. The method 2000 may take advantage of constructive solid geometry (CSG) operation(s) to remove a volume from another, modifying 3D polygon meshes in proximity with an impact to be modified by having one ore more portions thereof removed from the computer generated environment.

In some embodiment, the method 2000 may comprise, before beginning the computer simulation, identifying one or more opened polygon meshes forming non-watertight meshes (e.g., using the processor module 1230). Identifying the opened polygon mesh(es) may be performed by computing connectivity graphs or other logical representations of the polygon meshes. The method 2000 may also comprise, for each identified opened polygon mesh, attempting to close the corresponding polygon mesh and, if not possible, marking the corresponding polygon mesh as un-damageable.

The method 2000 comprises during the computer simulation, determining coordinates 2010, in the computer generated environment, of a virtual impact having an effective radius (e.g., using the processor module 1230). In some embodiments involving more than one computer system, the virtual impact event may be shared on a simulation network.

As an option, the method 2000 may further comprise, after determining 2010 the coordinates, rendering at least one temporary image for display comprising a distracting visual effect at or near the determined coordinates at least until rendering the at least one damaged-enhanced image is performed (e.g., using the processor module 1230). In some embodiments, the distracting visual effect may actually be disconnected from the coordinates of the virtual impact, but still provide the distracting effect (e.g., rendering 2D images considering the field of view).

The method 2000 then follows with identifying 2020, at the coordinates, a first plurality of rendering faces (e.g., triangles) affected by the virtual impact considering the effective radius (e.g., using the processor module 1230). The first plurality of rendering faces is associated with at least one 3D polygon mesh of the computer generated environment. The effective radius may be fixed in the computer generated environment or may be determined from the operation(s) performed to trigger the virtual impact (e.g., type of bomb/missile used, etc.) and/or from the at least one 3D polygon mesh of the computer generated environment (simulated material of the polygon being concrete, sand, etc.).

Prior to identifying 2020 the first plurality of rendering faces, the method 2000 may also comprise verifying that the at least one 3D polygon mesh are not marked as un-damageable. When the 3D polygon mesh is marked as un-damageable, then the damaged-enhanced rendered images may be limited to the distracting effect discussed previously.

Afterwards, the method 2000 comprises clipping 2030 the first plurality of rendering faces to a mathematically-defined subtraction shape computed considering the effective radius (e.g., using the processor module 1230). The mathematically-defined subtraction shape may be a sphere or a spheroid expressed by a single, linear, mathematical formula. The sphere or spheroid may be preferred for simplifying the clipping 2030 operation, which is expected to be performed at run-time. However, depending on the expected processing capabilities of the computer system 1200 involved in the computer simulation, more complex mathematically-defined subtraction shapes, which may further include randomness, may be used, e.g., to obtain a more realistic effect. Optionally, the method 2000 may further comprise, before clipping 2030, determining that each of the at least one 3D polygon mesh forms a watertight mesh. As another option, the method 2000 may further comprise, after identifying 2020 the affected first plurality of rendering triangles, buffering the first plurality of rendering triangles thereby allowing to undo the clipping 2030. Clipping 2030 the rendering face(s) may be performed by indicating a null (or minimal) surface for the to-be-removed rendering face(s). Using this technique may simplify the overall procedure by limiting the complexity of the computation of the newly formed 3D polygon mesh(es).

The method 2000 then comprises computing 2040 a second plurality of rendering faces from the clipped first plurality of rendering faces (e.g., using the processor module 1230), thereby defining at least one newly formed 3D polygon mesh, and rendering 2050 at least one damaged-enhanced image for display comprising a subset of the second plurality of rendering faces using a visual texture, the subset being determined from a field of view of the computer simulation (e.g., using the image generator module 1232).

Optionally, the method 2000 may be performed at runtime by a decentralized processing unit associated with a simulated vehicle of the computer generated environment in a limited number of milliseconds. The field of view is defined, in this exemplary embodiment, from a user's position within the simulated vehicle. Still in this exemplary embodiment, the method 2000 may further comprise, at a centralized processing unit, computing the at least one newly formed 3D polygon mesh from the determined coordinates. Computing at the centralized processing unit may be performed independently (and optionally in parallel) from the decentralized processing unit and in non-real-time priority processing. The centralized processing unit may also persistently update or store the at least one newly formed 3D polygon mesh into the storage module 1400.

Computing the at least one newly formed 3D polygon mesh at the centralized processing unit may also optionally be performed using a second mathematically-defined subtraction shape more complex than the mathematically-defined subtraction shape used at the decentralized processing unit.

The computer simulation may optionally involve a second decentralized processing unit associated with a second simulated vehicle of the computer generated environment having a second field of view defined from a second user's position within the second simulated vehicle. The method 2000 may then also further comprise loading, at the second decentralized processing unit of the computer simulation, the at least one newly formed 3D polygon mesh data, computed by the centralized processing unit, from the storage module 1400 (e.g., when the 3D polygon mesh enters the second field of view).

The method 2000 may also further comprise receiving, at the second decentralized processing unit, the coordinates of the virtual impact (e.g., from the simulation network) and computing, at runtime and in parallel to the (first) decentralized processing unit, the at least one newly formed 3D polygon mesh. No matter if computed locally or loaded from the storage module 1400, the at least one newly formed 3D polygon mesh is rendered by the second decentralized processing unit similarly to the (first) decentralized processing unit. Skilled persons will understand that a subsequent virtual impact could be initiated from the second decentralized processing unit that may then itself execute the exemplified method 2000.

The method 2000 may further comprise, after computing 2040 the second plurality of rendering faces, testing the at least one newly formed 3D polygon mesh for loops.

Rendering 2050 the second plurality of rendering faces may also further comprise applying a damage texture, fading outwardly from the coordinates and exceeding the effective radius, on a subset of the second plurality of rendering faces corresponding to surfaces previously represented in at least the first plurality of rendering faces.

Figure 3:
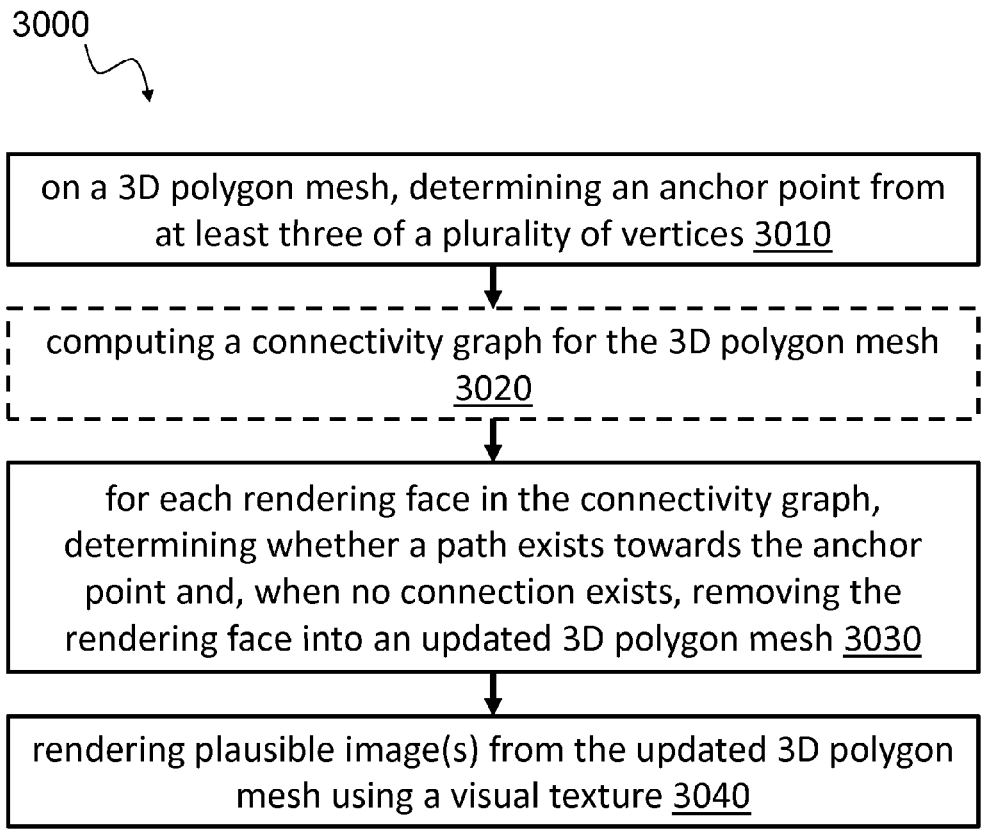
FIG. 3 is a flow chart of a second exemplary rendering method in accordance with a second set of embodiments of the present invention.

FIG. 3 illustrates an exemplary method 3000 for rendering plausible images of a three-dimensional (3D) polygon mesh in a computer simulation in accordance with a second set of embodiments. The computer simulation is expected to have a virtual gravity force effective within its computer generated environment. The memory module 1220 may be used for storing respective representations of a plurality of 3D polygon meshes of the computer simulation. The plurality of 3D polygon meshes to be stored may be determined from at least a field of view of the computer simulation, e.g., so that the determined plurality of 3D polygon are available for processing at runtime.

The 3D polygon meshes may be defined (e.g., in the representations from the memory module 1220) using a plurality of vertices providing a plurality of rendering faces (e.g., triangles). The method 3000 comprises determining 3010 an anchor point from at least three of the plurality of vertices of the 3D polygon mesh (e.g., using the processor module 1230). The anchor point indicates a connection between the 3D polygon mesh and the ground or between the 3D polygon mesh and one or more collocated 3D polygon mesh, ultimately connected to the ground.

For each one of the rendering faces of the 3D polygon mesh, the method 3000 follows with determining 3030 whether a path exists towards the anchor point and, when no connection exists, removing the one rendering face from the 3D polygon mesh into an updated 3D polygon mesh (e.g., using the processor module 1230). Removing the rendering face may be performed by indicating a null (or minimal) surface for the to-be-removed rendering face. Using this technique may simplify the overall procedure by limiting the complexity of the computation of the newly formed 3D polygon mesh(es).

The updated 3D polygon mesh comprising a subset of the plurality of rendering faces is then rendered for display 3040 using a visual texture (e.g., using the image generator module 1232). The subset of rendering faces is determined from the field of view of the computer simulation.

In some embodiments, the method 3000 may also comprise, prior to removing the rendering faces 3030, determining (not shown) whether a direct connection exists from the rendering faces to the ground. When a direct ground connection exists, the rendering faces are closed (see first set of embodiments) and one more newly formed 3D polygon mesh is computed and further rendered.

The method 3000 may comprise computing 3020 a connectivity graph (e.g., as a representation of the 3D polygon mesh) from the plurality of rendering faces representing the 3D polygon mesh (e.g., using the processor module 1230). When the connectivity graph is used as the representation of the 3D polygon mesh, determining that the path does not exist towards the anchor point involves removing the one rendering face from the connectivity graph into an updated connectivity graph representing the updated 3D polygon mesh.

For instance, a dedicated processing unit may be associated with a simulated vehicle of the computer generated environment and the field of view may be defined from a user's position within the simulated vehicle The method 3000 for rendering the plausible images may be performed at runtime by the decentralized processing unit in a limited number of milliseconds (e.g., using the processor module 1230).

The method 3000 may also comprise replacing, at runtime, the impacted rendering face(s) in the connectivity graph with a plurality of new rendering faces. The replacement may be performed before determining whether the path exists towards the anchor point and following a virtual impact on the 3D polygon mesh affecting at least one impacted rendering face from the plurality of rendering faces (see first set of embodiments).

Before rendering the 3D polygon mesh, the method 3000 may also comprise, at runtime, determining a center of mass of a part the 3D polygon mesh from the plurality of vertices associated with the part and determining that the part of the 3D polygon mesh is unstable (or unbalanced) from the perspective of the anchor point considering the virtual gravity force applied in the simulation. Then, a subset of unstable rendering faces from the plurality of rendering faces may be identified on the unstable part and the unstable rendering faces may then be removed from the connectivity graph into the updated 3D polygon mesh.

Figure 4:
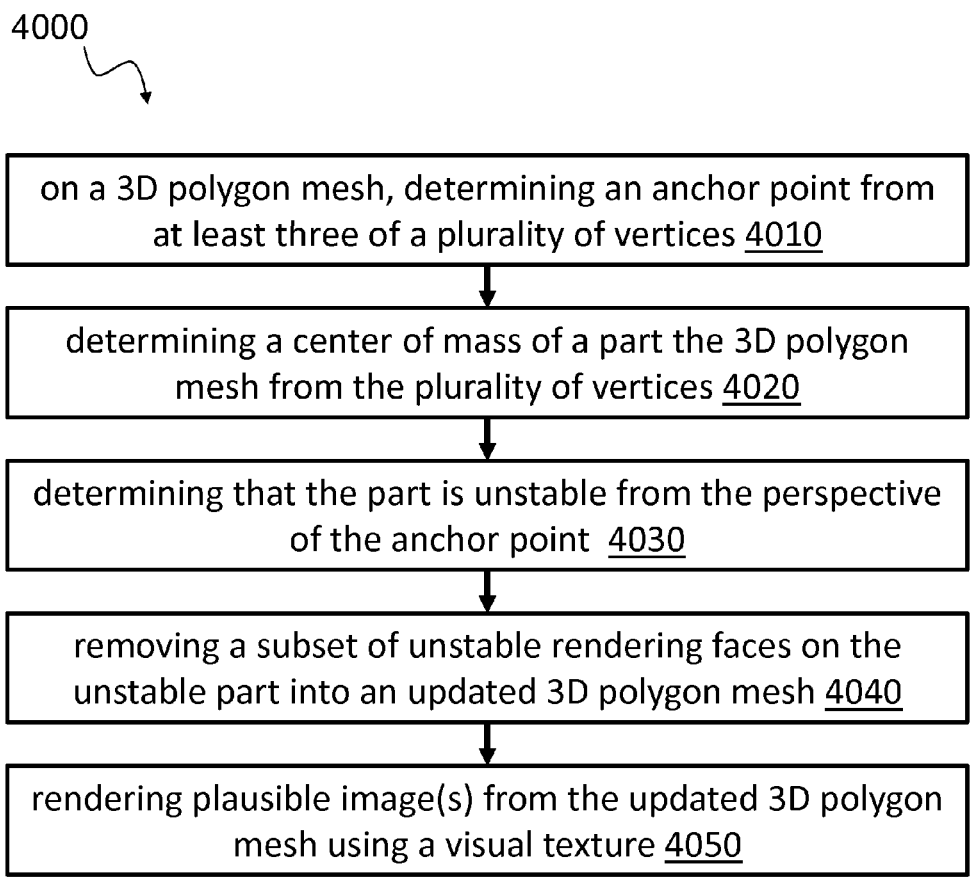
FIG. 4 is a flow chart of a third exemplary rendering method in accordance with the second set of embodiments of the present invention.

FIG. 4 illustrates another exemplary method 4000 for rendering plausible images of a three-dimensional (3D) polygon mesh in a computer simulation in accordance with the second set of embodiments. The computer simulation is expected to have a virtual gravity force effective within its computer generated environment. The memory module 1220 may be used for storing respective representations of a plurality of 3D polygon meshes of the computer simulation. The plurality of 3D polygon meshes to be stored may be determined from at least a field of view of the computer simulation, e.g., so that the determined plurality of 3D polygon are available for processing at runtime.

The 3D polygon meshes may be defined (e.g., in the representations from the memory module 1220) using a plurality of vertices providing a plurality of rendering faces (e.g., triangles). The method 4000 comprises determining 4010 an anchor point from at least three of the plurality of vertices of the 3D polygon mesh (e.g., using the processor module 1230). The anchor point indicates a connection between the 3D polygon mesh and the ground or between the 3D polygon mesh and one or more collocated 3D polygon mesh, ultimately connected to the ground. (e.g., using the processor module 1230)

The method 4000 then follows, at runtime, with determining 4020 a center of mass of a part the 3D polygon mesh from the plurality of vertices associated with the part (e.g., using the processor module 1230) and determining 4030 still at runtime that the part of the 3D polygon mesh is unstable from the perspective of the anchor point considering the virtual gravity force applied in the simulation. A subset of unstable rendering faces from the plurality of rendering faces on the unstable part may then be removed 4040 into an updated 3D polygon mesh. Thereafter, e.g., using the image generator module 1232, the method 4000 follows with rendering 4050 the updated 3D polygon mesh for display comprising a subset of the plurality of rendering faces using a visual texture, the subset being determined from a field of view of the computer simulation.

Whether in the context of the method 3000 or the method 4000, new rendering faces may also be appended (e.g., to a connectivity graph) to close the updated 3D polygon mesh.

The 3D polygon mesh may have different attributed associated therewith such as a virtual tensile strength and a virtual density value. When removing the unstable rendering faces 4040, the virtual tensile strength and virtual density value may be use to compute a virtual collapsing pressure for a fulcrum area of the unstable part compared to the center of mass. The removal could take place only when the virtual collapsing pressure exceeds the virtual tensile strength.

Determining that the part is unstable 4030 may optionally be performed by locating a narrow link surrounding the virtual impact on the 3D polygon mesh. The narrow link may define a fulcrum area between the part and another part of the 3D polygon mesh connected to the anchor point. It may this be determined that the part is unstable 4030 when the structure above the narrow link is not connected to the anchor point and the center of mass is not above the fulcrum area. Locating the narrow link in the 3D polygon mesh may be performed by identifying, surrounding a virtual impact, a lowest isolated vertex from the plurality vertices and, until the narrow link is located or until a performance-based threshold is attained (e.g., time limit, number of frame(s) limit, number of processing cycles, etc.), determining the narrow link as the minimum fulcrum area between the part and the other part connected to the anchor point starting from a horizontal plane at the lowest isolated vertex and considering the closest neighbor vertices thereof.

The method 3000 and/or the method 4000 of removing the relevant rendering face from the updated 3D polygon mesh (e.g., from the corresponding connectivity graph) may also be performed at a centralized processing unit independently from the decentralized processing unit and in non-real-time priority processing, e.g., using the same or a more complex procedure. Relevant data may then be stored on the storage module 1400 so that decentralized processing unit(s) are able to load the relevant data (e.g., when the updated 3D polygon mesh enters or reenters their respective field of view).

Figure 5:
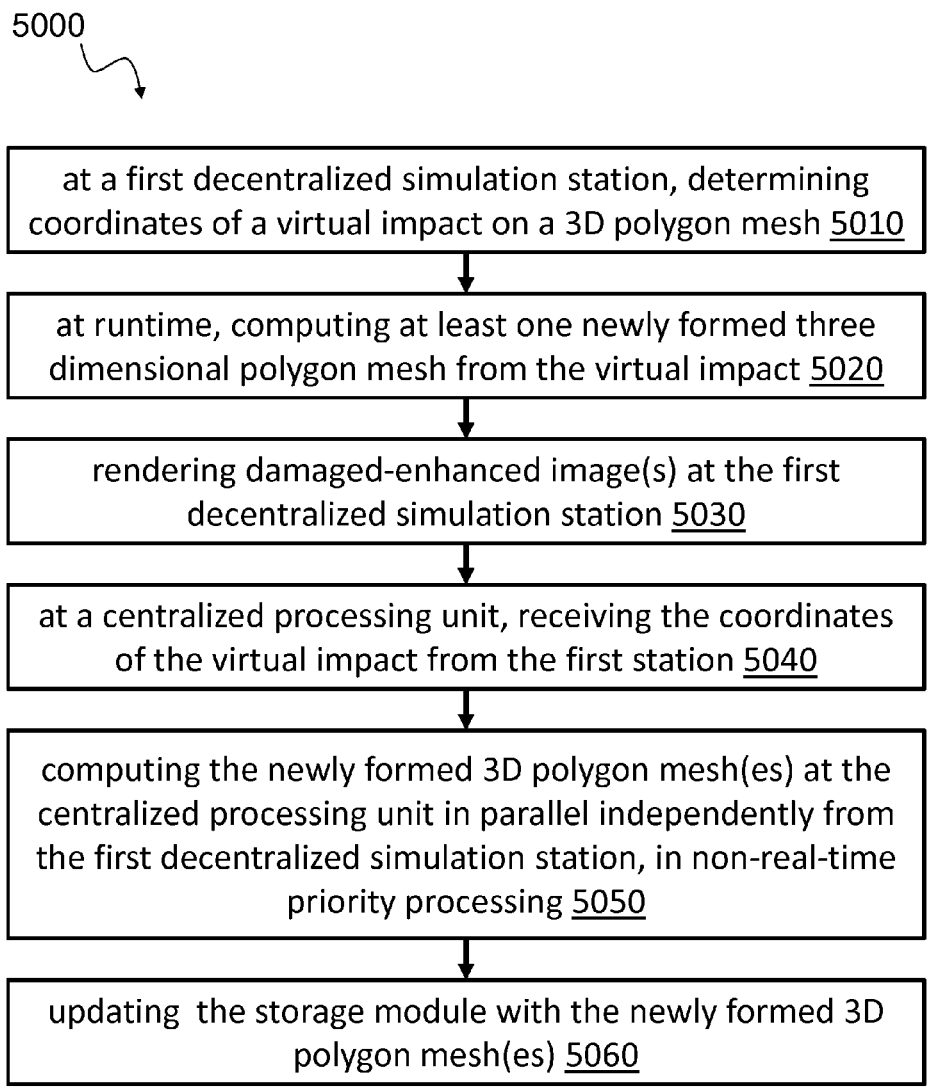
FIG. 5 is a flow chart of an exemplary data updating method in accordance with a third set of embodiments of the present invention.

FIG. 5 illustrates an exemplary method 5000 for updating damaged-enhanced images in the computer simulation in accordance with a third set of embodiments. The computer simulation comprises a computer generated environment. The computer simulation is associated to a storage module 1400 accessible to at least a first decentralized simulation station, a second decentralized simulation station (e.g., where a user interacts with the simulation) and a centralized processing unit thereof (e.g., a simulation engine). The method 5000 comprises, at the first decentralized simulation station, during the computer simulation, determining 5010 coordinates of a virtual impact on a three dimensional (3D) polygon mesh of the computer generated environment and, at runtime, computing 5020 at least one newly formed 3D polygon mesh from the virtual impact without updating the storage module 1400. Then, at least one damaged-enhanced image of the at least one newly formed 3D polygon mesh is rendered 5030 for display from a field of view of the first decentralized simulation station. The method 5000 also comprises, at the centralized processing unit, receiving 5040 the coordinates of the virtual impact from the first decentralized simulation station and, at the second decentralized simulation station, receiving the coordinates of the virtual impact. The centralized processing unit then computes 5050, independently and in non-real-time priority processing, the newly formed 3D polygon mesh(es) from the determined coordinates and persistently updates the storage module 1400 associated to the simulation with the at least one newly formed 3D polygon mesh.

The first decentralized simulation station may be associated to a first simulated vehicle of the computer generated environment. The first field of view of the first decentralized simulation station may then be defined from a user's position within the first simulated vehicle. Likewise, the second decentralized simulation station may be associated to a second simulated vehicle of the computer generated environment. A second field of view of the second decentralized simulation station may then be defined from a user's position within the second simulated vehicle.

Upon receiving the coordinates of the virtual impact at the second decentralized simulation station, the second decentralized simulation station may compute the at least one newly formed 3D polygon mesh from the received coordinates, at runtime, in parallel and independently from the first decentralized simulation station.

The second decentralized simulation station of the computer simulation may alternatively load the at least one newly formed 3D polygon mesh from the storage module 1400 when the at least one newly formed 3D polygon mesh enters the second field of view of the second decentralized simulation station.

Computing 5050 the at least one newly formed 3D polygon mesh at the centralized processing unit may, in addition, be performed in parallel using a more complex mathematical operation compared to computing 5020 of the first decentralized simulation station. The first decentralized simulation station may also load (or reload) the at least one newly formed 3D polygon mesh from the storage module 1400 when the at least one newly formed 3D polygon mesh reenters the first field of view.

The method 5000 may further involve updating 5060 by storing at least one new file in a file system of the storage module 1400 corresponding to the at least one newly formed 3D polygon mesh and storing at least one event in a database of the storage module 1400 corresponding completion of the computation of the at least one newly formed 3D polygon mesh.

The centralized processing unit may comprise a storage module 1400 implementing a file system and computing 5050 at the centralized processing unit may further comprises locating a latest version of a content file in the file system that corresponds to the 3D polygon mesh and verifying if at least one transaction marker file associated with the content file exists. The transaction marker file(s) indicating if the content file is currently subject to an ongoing transaction. When the content file is not currently subject to an ongoing transaction, then the computing 5050 may be performed by copying the content file into a new content file on the file system, updating the new content file with the newly formed 3D polygon mesh(es), and updating the transaction marker file(s). A name of the new content file reflects a newer version compared to the latest version. When the content file is currently subject to an ongoing transaction, the method 5000 may further comprise waiting until the at least one transaction marker file indicates completion of the ongoing transaction before creating a new start transaction marker file and updating the new content file with the newly formed 3D polygon mesh(es). A name of the new start transaction marker file may reflect a newer version compared to the name of the content file following the ongoing transaction and the name of the new content file may reflect the same version as the start transaction file. The method 5000 then follows with creating a new end transaction marker file, a name of the end transaction marker file reflecting the same version as the start transaction marker file.

The centralized processing unit comprises a storage module 1400 implementing a file system and the method further comprises, after receiving 5040 the coordinates of the virtual impact from the first decentralized simulation station and before updating 5060 from the centralized processing unit, receiving coordinates of a second virtual impact on the 3D polygon mesh from the second decentralized simulation station at the centralized processing unit. The method 5000 may then further comprise locating a latest version of a content file in the file system that corresponds to the 3D polygon mesh and creating a first start transaction marker file with a name that reflects a first new version compared to the latest version as well as creating a first new content file with the newly formed 3D polygon mesh(es) computed from the virtual impact. The name of the first new content file reflects the first new version. A first end transaction marker file is then created with a name that reflects the same version as the first start transaction marker file. In this example, the method 5000 then follows with creating a second start transaction marker file with a name that reflects a second new version compared to the first new version, creating a second new content file with the newly formed 3D polygon mesh(es) computed from the second virtual impact. The name of the second new content file reflects the second new version. A second end transaction marker file with a name reflecting the same version as the second start transaction marker file is then created before the centralized processing unit propagates 5060 the newly formed 3D polygon mesh(es) after the creation of the second end transaction marker file to at least the first decentralized simulation station and the second decentralized simulation station.

The exemplary method 2000 may be illustrated, in one embodiment, with regards to the example of FIG. 6. FIGS. 6A to 6E show exemplary visual representations of the exemplary rendering method in accordance with a first set of embodiments of the present invention. On FIG. 6A, an exemplary 3D polygon mesh 6000 is depicted using rendering faces A to T with faces U and V implicitly present opposite respectively faces M and N. For the sake of clarity, the polygon mesh 6000 as depicted does not show faces behind B/C and S/Q. In the example of FIG. 6, the rendering faces are triangles. A logical representation in the format of a connectivity graph 6100 or connectivity tree can be built from the exemplary polygon mesh 6000, as shown in FIG. 6B. Of course, skilled persons will recognize that a typical simulation would involve a plurality of 3D polygon meshes and that the polygon mesh 6000 is chosen to illustrate the teachings of the invention.

The connectivity graph 6100 may be computed at runtime, while the simulation is ongoing (e.g., as new polygon meshes enter the field of view during the simulation), but computing may advantageously be performed during a pre-processing phase, together with the computing of other connectivity graphs for any polygon mesh that could be affected by the present invention. The pre-processing phase may also be used to generate hollow geometry of the 3D polygon meshes as well as detecting floating parts. The connectivity graph may be stored in the storage module 1400 that may be local (e.g., 1400A collocated with the processor module 1230 rendering the images) or remote 1400B.

During the connectivity graph computing, the polygon mesh 6000 may be analyzed to determine if it forms a fully closed polygon mesh (also referred to as a watertight mesh). In the example of FIG. 6, the floor (e.g., bottom section connected to D, F, G, V, I, N, O) is absent. While polygon meshes without floors are typically useful to avoid rendering a number of non-visible rendering faces required to illustrate a given 3D polygon mesh (e.g., to save triangles), the clipping 2030 and the computing 2050 are meant to be done on a watertight mesh. It is possible to add some geometry to close the polygon mesh 6000 (e.g., adding rendering faces, which are not meant to be visible, to existing polygon meshes). The addition of rendering faces, if ever required, is to be performed before the clipping 2030 and the computing 2050. While the addition may be performed at runtime, the addition may take too much processing time to fit within a maximum time (or number of processing cycles) allowed to maintain expected visual quality of the simulation for at least plausibly representing damages. Therefore, it may be advantageous to add the rendering faces when the polygon mesh 6000 is loaded or in a database storing the polygon mesh 6000 (e.g., in a model of the simulation) prior to loading the polygon mesh 6000.

By adding closing geometry, most of the polygon meshes (or 3D shapes) in the simulation become watertight. However, there maybe exceptions for which various procedures may be performed to make them watertight. More specifically, some meshes have 2D parts snapped to them, such as balcony ramps, fences, vegetation foliage, etc. Those can be isolated and only be clipped by the virtual impact. As they represent 2D content there is no need to generate any hollow geometry to connect their clipped surfaces.

Figure 6A:
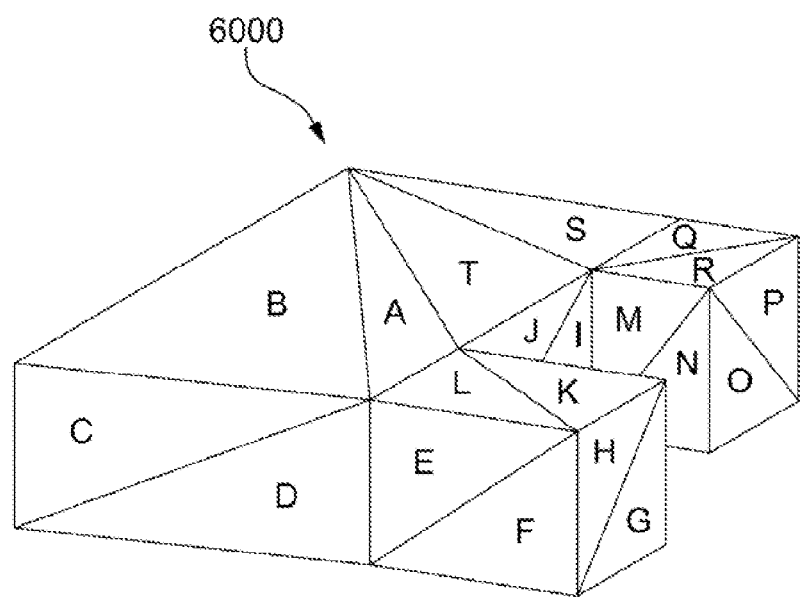
FIGS. 6A, 6B, 6C, 6D and 6E, hereinafter referred to together as FIG. 6, are exemplary visual and logical representations of the exemplary rendering method in accordance with a first set of embodiments of the present invention.
Figure 6B:
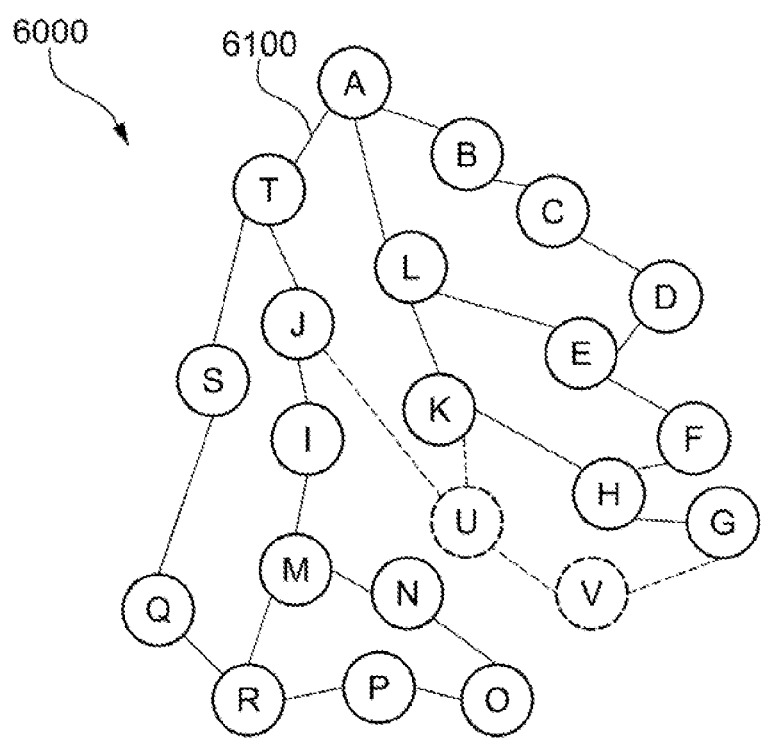
Figure 6C:
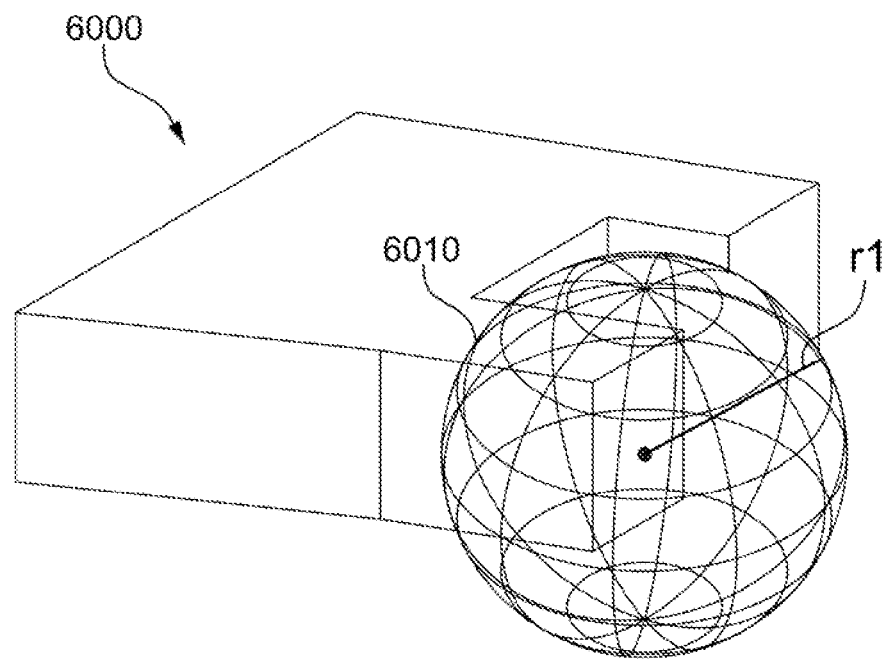
Figure 6D:
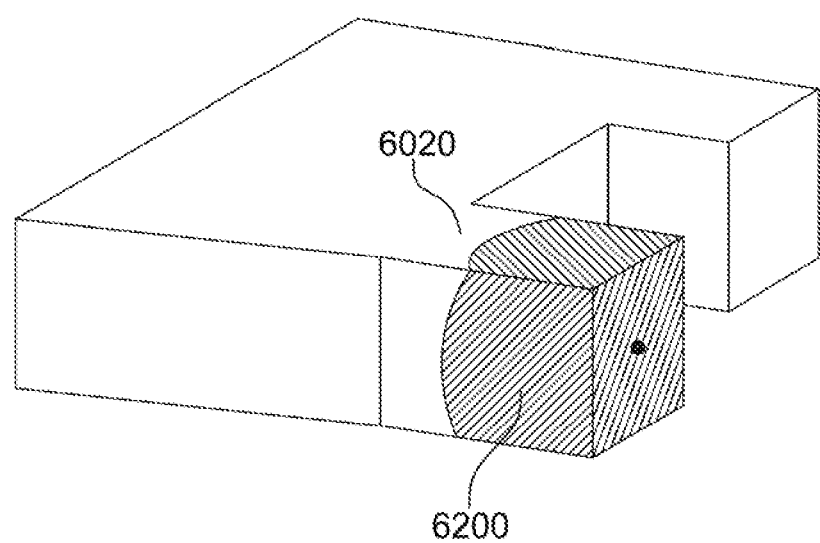

FIG. 6C shows a virtual impact 6010 having coordinates on the face defined by rendering faces G and H having an effective radius r1 (2020). The virtual damage 6010, in the present example is a mathematically defined subtraction shape defined as a sphere having the effective radius r1. The connectivity graph 6100 may be used to identify rendering faces (triangles in the example of FIG. 6) affected by the impact 6010. In the example of FIG. 6, triangles E, F, G, H, K, L, U and V are affected by the impact 6010. For the sake of clarity, U and V will be further discussed in the following discussion, but it is understood that they are also similarly affected. In a first time, the affected triangles may be removed from the connectivity tree (e.g., actually removed or their surface may be collapsed to a null or minimal value). In some embodiments, the removed rendering faces may be kept (e.g., original connectivity graph or portion thereof stored separately in memory) in order to be able to undo the damage 6010.

Figure 6E:
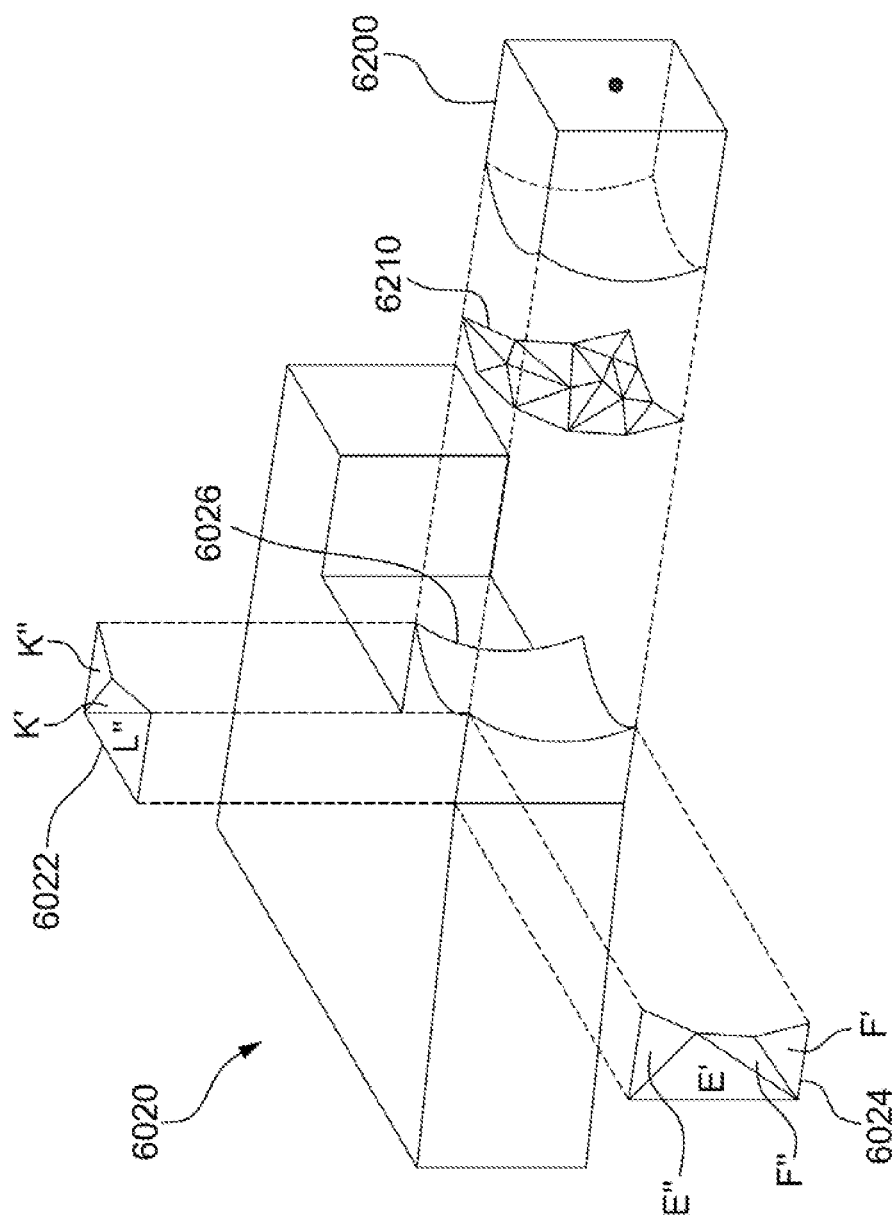

The affected rendering faces are thereafter clipped 2030 against the sphere defined by r1. The clipping 2030 is followed by the computing 2050 of the new rendering faces defining two new polygon meshes 6020 and 6200 from the polygon mesh 6000, as depicted on FIG. 6D. For the sake of illustration, FIG. 6E shows the polygon mesh 6200 detached from the polygon mesh 6020. The new rendering faces may be appended to the connectivity graph. The new rendering faces may also be marked differently (e.g., timestamp and/or specific indication) in the connectivity graph (e.g., to be able to locate them more quickly for a subsequent application of a specific damage mask/texture, to undo the procedure, etc.).

With reference to the example of FIG. 6, clipping 2030 the triangles and computing 2050 the new polygon meshes 6020 and 6200 may be performed by creating linear segments matching a circle arc from the intersection of the sphere defined by r1 and the polygon mesh 6000. The linear segments may then be connected to form the new triangles and verification may be performed to locate closed paths (loops). Once the new triangles have been clipped by the volume, any remaining 3D holes that might have been generated are closed by clipping the volume itself with all the closed paths formed by the curved cut-outs into the new triangles. Identifying closed path can be done by considering edges shared by neighbor triangles. Starting from an initial triangle clip path, existence of a neighbor is verified and if it exists, there must necessarily be a path with a common intersection point. The procedure is repeated until the initial triangle is reached or there is a missing neighbor. If the initial triangle is reached, a closed path as been found. This has the exemplary advantage of allowing the procedure to be performed with existing content that was not designed to be damaged.

It may be helpful to distinguish the winding of closed paths. This is required when the impact crosses both front-faced and back-faced polygon meshes, which happens when it affects the whole width of the object or for buildings with modeled interiors. The winding of the closed path is defined by the winding of the triangles it intersects, relative to a ray passing from a fixed point in the interior of the impact through the center of the path. Clockwise winding paths clip all what is outside of them and counter-clockwise winding paths clip all what is inside of them. The orientation of the linear segments may be important depending on the triangle winding (it may be kept at the time of creation). What remains is the impact interior that must be displayed to hide the non-modeled building interior.

Each closed path is tessellated with additional vertices added into the region delimited by the closed paths to smooth the curves. All this geometry can be grouped for all the damages because its texture content does not depend on the impacted geometry. The triangles obtained are mapped with a procedural texture 2050 that may further be independent of the impact type. In order to tessellate the closed paths, once the mesh is generated, it is snapped to the clipped watertight mesh as to generate a new watertight mesh that can be further damaged, if needed.

The exemplary method 3000 may be illustrated, in one embodiment, with regards to the example of FIG. 7. FIG. 6B and FIGS. 7A to 7E show exemplary visual representations of the exemplary method 3000 in accordance with the second set of embodiments of the present invention. On FIG. 7A, an exemplary 3D polygon mesh 7000 is depicted using rendering faces A to T with faces U and V implicitly present opposite respectively faces M and N. For the sake of clarity, the polygon mesh 7000 as depicted does not show faces behind B/C and S/Q. In the example of FIG. 7, the rendering faces are triangles. The polygon mesh 7000 as depicted is subject to an intuitive top-down gravitational force. Of course, different simulations (or simulation environments within a single simulation) may have different rules, including variable gravitational force (e.g., in more game-related environment). In the example of FIG. 7, anchor point may be determined 3010 as a connection to another polygon mesh (not shown) behind B/C, the polygon mesh 7000 being suspended therefrom.

The logical representation of FIG. 6B in the format of the connectivity graph 6100 or connectivity tree from the exemplary polygon mesh 7000 also initially applies to the exemplary polygon mesh 7000. The connectivity graph may be computes (3020) from the plurality of rendering faces at runtime and/or at load time. As previously mentioned, skilled persons will recognize that a typical simulation would involve a plurality of 3D polygon meshes and that the polygon mesh 7000 is chosen to illustrate the teachings of the invention.

Figure 7A:
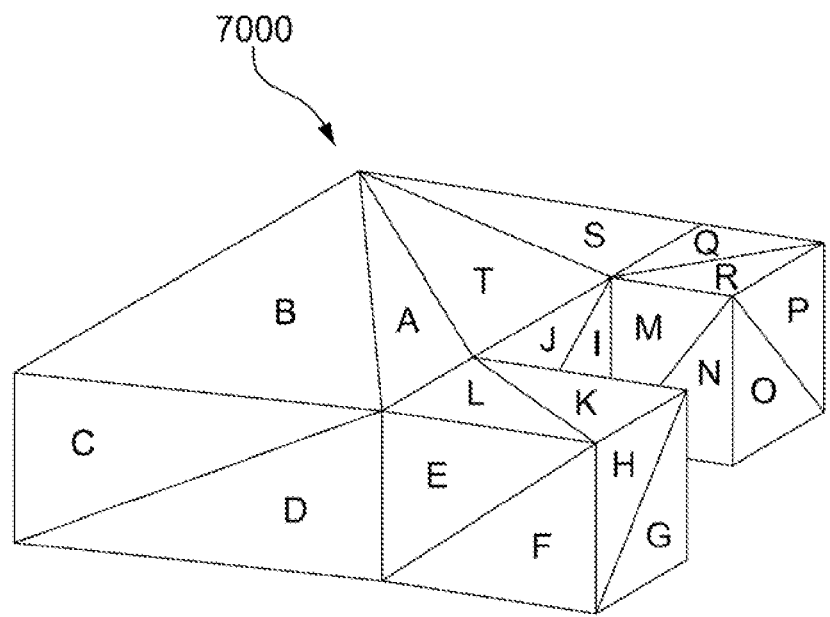
FIGS. 7A, 7B, 7C, 7D and 7E, hereinafter referred to together as FIG. 7, are exemplary visual representations of the exemplary rendering method in accordance with a second set of embodiments of the present invention.
Figure 7B:
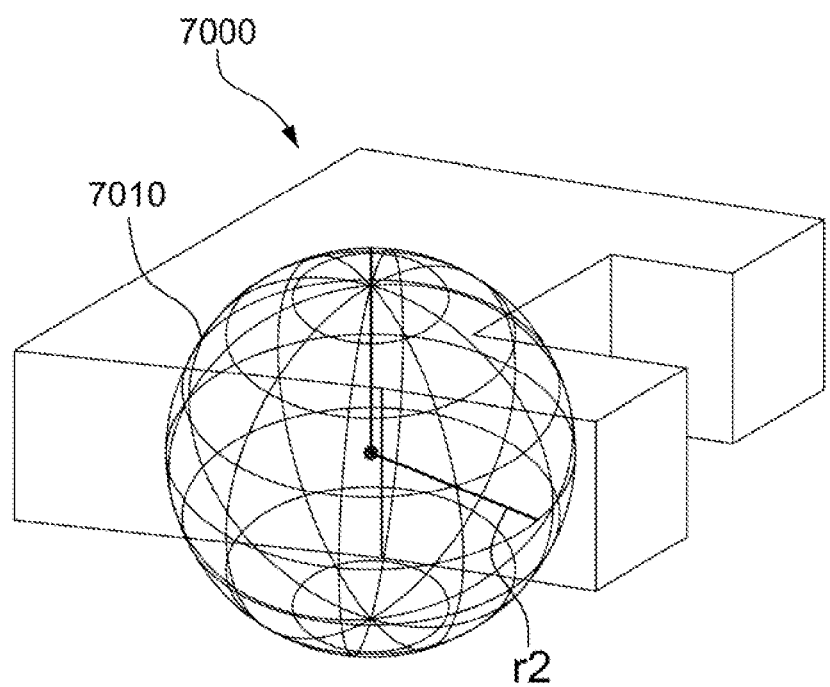
Figure 7C:
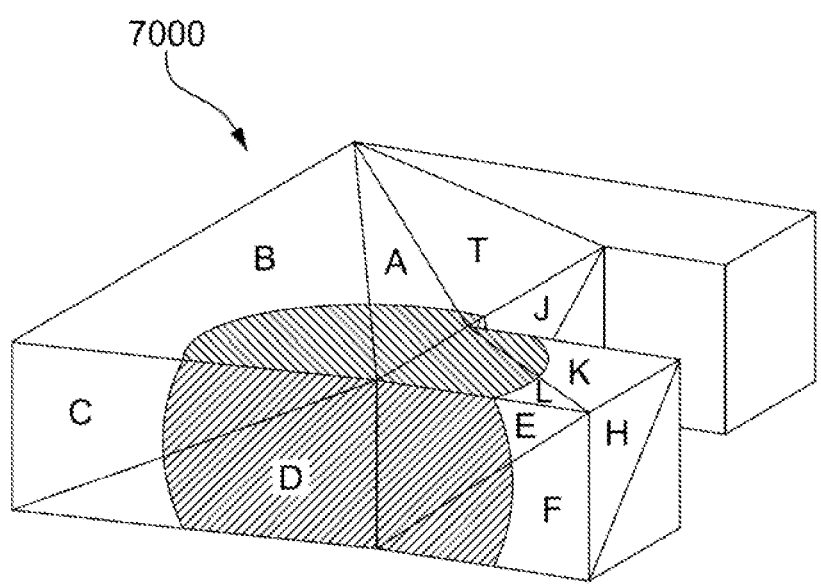

FIG. 7B shows a virtual impact 7010 having coordinates on the rendering face A having an effective radius r2 (2020). The virtual damage 7010, in the present example is a mathematically defined subtraction shape defined as a sphere having the effective radius r2. The connectivity graph 6100 may be used to identify rendering faces (triangles in the example of FIG. 7) affected by the impact 7010. On FIG. 7C, only the triangles directly by the impact 7010 are depicted (i.e., A, B, C, D, E, F, H, J, K, L and T).

Figure 7D:
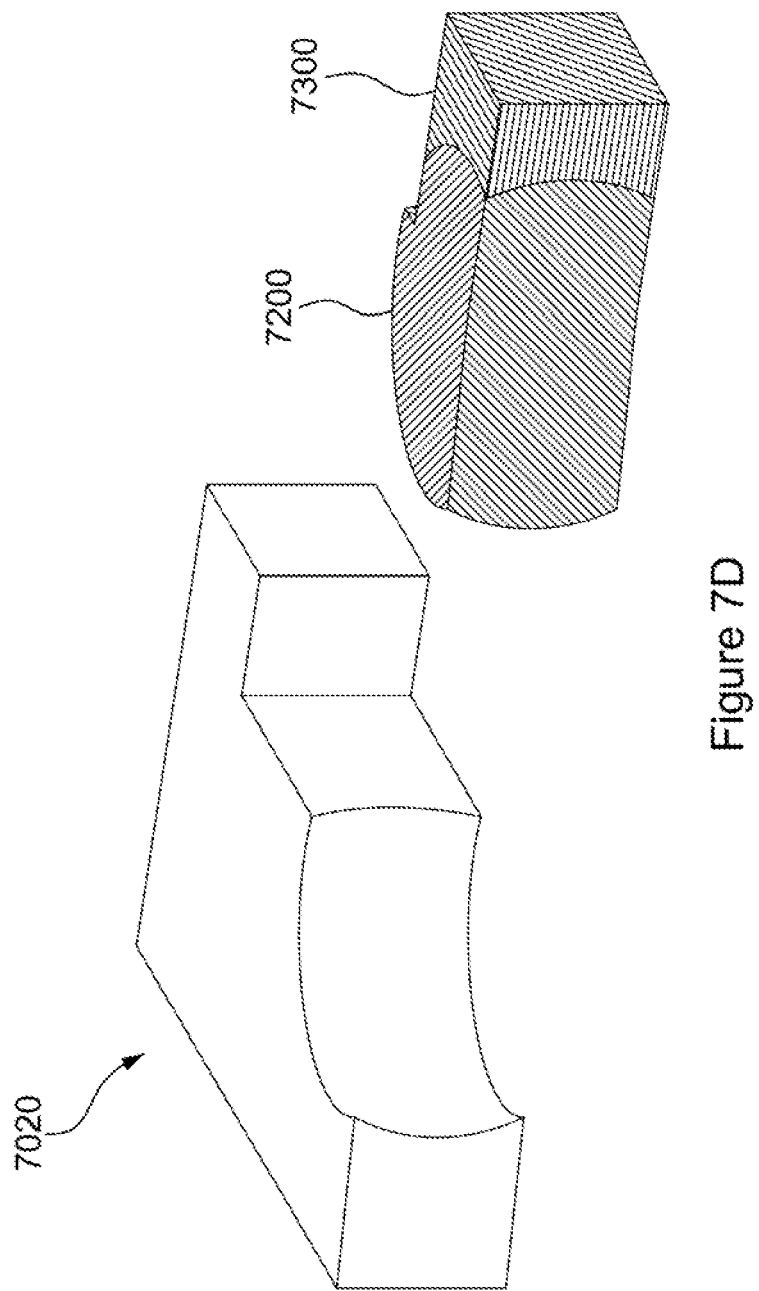
Figure 7E:
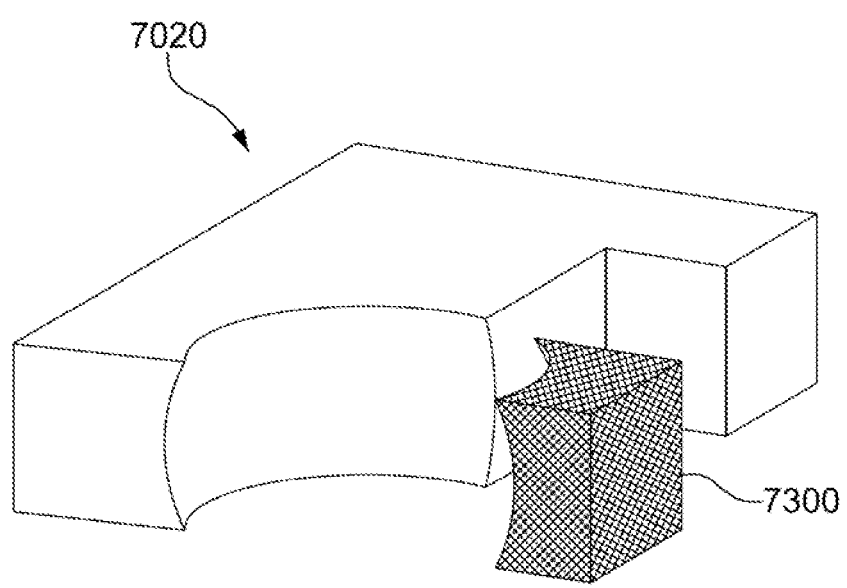

New rendering faces are computed from the impact 7010 and define three new polygon meshes 7020, 7200 and 7300 from the polygon mesh 7000, as depicted on FIG. 7D. For the sake of illustration, FIG. 7D show the polygon meshes 7200 and 7300 detached from the polygon mesh 7020. The new rendering faces may be appended to the connectivity graph into an updated connectivity graph (not shown). The new rendering faces may also be marked differently (e.g., timestamp and/or specific indication) in the connectivity graph (e.g., to be able to locate them more quickly for a subsequent application of a specific damage mask/texture, to undo the procedure, etc.). In the example of FIG. 7, the polygon mesh 7200 is removed in a manner similar to the example of FIG. 6.

In the example of FIG. 7, traversal of the updated connectivity graph will allow for the determination that the triangles from the polygon mesh 7300 have no connectivity path reaching the previously defined anchor point X. The rendering faces from polygon mesh 7300 are this removed from the connectivity graph at the same time or subsequently to polygon mesh 7200. From the perspective of the user, the resulting polygon mesh 7020 should appear in a plausible manner. As mentioned before, special effects may be triggered to cover the removal of the polygon mesh(es) 7200 and/or 7300.

The processor module 1230 may represent a single processor with one or more processor cores or an array of processors, each comprising one or more processor cores. The memory module 1220 may comprise various types of memory (different standardized or kinds of Random Access Memory (RAM) modules, memory cards, Read-Only Memory (ROM) modules, programmable ROM, etc.). The network interface module 1210 represents at least one physical interface that can be used to communicate with other network nodes. The network interface module 1210 may be made visible to the other modules of the computer system 1200 through one or more logical interfaces. The actual stacks of protocols used by the physical network interface(s) and/or logical network interface(s) of the network interface module 1210 do not affect the teachings of the present invention. The variants of processor module 1230, memory module 1220, network interface module 1210 and storage devices module 1500 usable in the context of the present invention will be readily apparent to persons skilled in the art. Likewise, even though explicit mentions of the memory module 1220 and/or the processor module 1230 are not made throughout the description of the present examples, persons skilled in the art will readily recognize that such modules are used in conjunction with other modules of the computer system 1200 to perform routine as well as innovative steps related to the present invention.

A method is generally conceived to be a self-consistent sequence of steps leading to a desired result. These steps require physical manipulations of physical quantities. Usually, though not necessarily, these quantities take the form of electrical or magnetic/electromagnetic signals capable of being stored, transferred, combined, compared, and otherwise manipulated. It is convenient at times, principally for reasons of common usage, to refer to these signals as bits, values, parameters, items, elements, objects, symbols, characters, terms, numbers, or the like. It should be noted, however, that all of these terms and similar terms are to be associated with the appropriate physical quantities and are merely convenient labels applied to these quantities. The description of the present invention has been presented for purposes of illustration but is not intended to be exhaustive or limited to the disclosed embodiments. Many modifications and variations will be apparent to those of ordinary skill in the art. The embodiments were chosen to explain the principles of the invention and its practical applications and to enable others of ordinary skill in the art to understand the invention in order to implement various embodiments with various modifications as might be suited to other contemplated uses.

What is claimed is:

1. A method for updating damaged-enhanced three dimensional (3D) polygon meshes in a computer simulation, the computer simulation being associated to a storage module accessible to at least a first decentralized simulation station, a second decentralized simulation station and a centralized processing unit thereof, the storage module comprising a file system, the method comprising:
 at the first decentralized simulation station, during the computer simulation comprising a computer generated environment, determining coordinates of a virtual impact on a 3D polygon mesh of the computer generated environment;
 at the first decentralized simulation station and at runtime, computing at least one newly formed 3D polygon mesh from the virtual impact;
 at the first decentralized simulation station, rendering at least one damaged-enhanced image of the at least one newly formed 3D polygon mesh for display from a first field of view of the first decentralized simulation station;
 at the centralized processing unit, receiving the coordinates of the virtual impact;
 at the second decentralized simulation station, receiving the coordinates of the virtual impact;
 at the centralized processing unit, computing the at least one newly formed 3D polygon mesh from the received coordinates, wherein computing at the centralized processing unit is performed independently from the first decentralized simulation station, in non-real-time priority processing;
 at the centralized processing unit, locating a latest version of a content file in the file system that corresponds to the 3D polygon mesh;
 at the centralized processing unit, verifying if at least one transaction marker file associated with the content file exists, the at least one transaction marker file indicating if the content file is currently subject to an ongoing transaction; and
 from the centralized processing unit, when the content file is not currently subject to an ongoing transaction, persistently updating the storage module associated to the simulation with the at least one newly formed 3D polygon mesh by:
  copying the content file into a new content file on the file system;
  updating the new content file with the at least one newly formed 3D polygon mesh, a name of the new content file reflecting a newer version compared to the latest version; and
  updating the at least one transaction marker file.

2. The method for updating damaged-enhanced 3D polygon meshes of claim 1, wherein computing the at least one newly formed 3D polygon mesh from the virtual impact at the first decentralized simulation station at runtime is performed without updating the storage module.

3. The method for updating damaged-enhanced 3D polygon meshes of claim 1, wherein:
 the first decentralized simulation station is associated to a first simulated vehicle of the computer generated environment, wherein the first field of view of the first decentralized simulation station is defined from a user's position within the first simulated vehicle; and
 the second decentralized simulation station is associated to a second simulated vehicle of the computer generated environment, wherein a second field of view of the second decentralized simulation station is defined from a user's position within the second simulated vehicle.

4. The method for updating damaged-enhanced 3D polygon meshes of claim 3, further comprising, from the second decentralized simulation station of the computer simulation, loading the at least one newly formed 3D polygon mesh, computed by the centralized processing unit, from the storage module when the at least one newly formed 3D polygon mesh enters the second field of view of the second decentralized simulation station.

5. The method for updating damaged-enhanced 3D polygon meshes of claim 3, further comprising, at the second decentralized simulation station and upon receiving the coordinates of the virtual impact, computing the at least one newly formed 3D polygon mesh from the received coordinates, wherein computing at the second decentralized simulation station is performed at runtime independently from the first decentralized simulation station.

6. The method for updating damaged-enhanced 3D polygon meshes of claim 5 further comprising, at the first decentralized simulation station, loading the at least one newly formed 3D polygon mesh, computed by the centralized processing unit, from the storage module when the at least one newly formed 3D polygon mesh reenters the first field of view.

7. The method for updating damaged-enhanced 3D polygon meshes of claim 1, wherein persistently updating the storage module from the centralized processing unit is performed by further:
 storing at least one event in a database of the storage module corresponding to completion of the computation of the at least one newly formed 3D polygon mesh by the centralized processing unit.

8. The method for updating damaged-enhanced 3D polygon meshes of claim 1, wherein when the content file is currently subject to an ongoing transaction, the method further comprises:
 waiting until the at least one transaction marker file indicates completion of the ongoing transaction;
 creating a new start transaction marker file, a name of the new start transaction marker file reflecting a newer version compared to the name of the content file following the ongoing transaction;
 updating the new content file with the at least one newly formed 3D polygon mesh, the name of the new content file reflecting the same version as the start transaction file; and
 creating a new end transaction marker file, a name of the end transaction marker file reflecting the same version as the start transaction marker file.

9. The method for updating damaged-enhanced 3D polygon meshes of claim 1, further comprising:

after receiving the coordinates of the virtual impact at the centralized processing unit and before persistently updating the storage module from the centralized processing unit, receiving coordinates of a second virtual impact on the 3D polygon mesh at the centralized processing unit;

from the centralized processing unit, before copying the content file into the new content file on the file system, creating a first start transaction marker file of the at least one transaction marker file, a name of the first start transaction marker file reflecting a first new version compared to the latest version;

wherein copying the content file into the new content file on the file system and updating the new content file is performed by further creating a first new content file with the at least one newly formed 3D polygon mesh computed from the virtual impact, the name of the first-new content file reflecting the first new version; and wherein updating the at least one transaction marker file is performed by further creating a first end transaction marker file of the at least one transaction marker file, a name of the first end transaction marker file reflecting the same version as the first start transaction marker file;

following creating the first end transaction marker file, creating a second start transaction marker file of the at least one transaction marker file, a name of the second start transaction marker file reflecting a second new version compared to the first new version;

creating a second new content file with the at least one newly formed 3D polygon mesh computed from the second virtual impact, the name of the second new content file reflecting the second new version; and creating a second end transaction marker file of the at least one transaction marker file, a name of the second end transaction marker file reflecting the same version as the second start transaction marker file.

10. A system for updating damaged-enhanced three dimensional (3D) polygon meshes in a computer simulation comprising:

a storage module associated with the computer simulation comprising a computer generated environment, the storage module comprising a file system;

a first decentralized simulation station for:
during the computer simulation, determining coordinates of a virtual impact on a 3D polygon mesh of the computer generated environment;
at runtime, computing at least one newly formed 3D polygon mesh from the virtual impact;
rendering at least one damaged-enhanced image of the at least one newly formed 3D polygon mesh for display from a field of view of the first decentralized simulation station;

a second decentralized simulation station for receiving the coordinates of the virtual impact;

a centralized processing unit for:
receiving the coordinates of the virtual;
computing the at least one newly formed 3D polygon mesh from the determined coordinates, wherein computing at the centralized processing unit is performed independently from the first decentralized simulation station, in non-real-time priority processing;
locating a latest version of a content file in the file system that corresponds to the 3D polygon mesh;
verifying if at least one transaction marker file associated with the content file exists, the at least one transaction marker file indicating if the content file is currently subject to an ongoing transaction; and
when the content file is not currently subject to an ongoing transaction, persistently updating the storage module associated to the simulation with the at least one newly formed 3D polygon mesh by:
copying the content file into a new content file on the file system;
updating the new content file with the at least one newly formed 3D polygon mesh, a name of the new content file reflecting a newer version compared to the latest version; and
updating the at least one transaction marker file.

11. The system for updating damaged-enhanced 3D polygon meshes of claim 10, wherein the first decentralized simulation station computes the at least one newly formed 3D polygon mesh from the virtual impact at runtime without updating the storage module.

12. The system for updating damaged-enhanced 3D polygon meshes of claim 11, wherein the second decentralized simulation station is further for loading the at least one newly formed 3D polygon mesh, computed by the centralized processing unit, from the storage module when the at least one newly formed 3D polygon mesh enters the second field of view of the second decentralized simulation station.

13. The system for updating damaged-enhanced 3D polygon meshes of claim 11, wherein the second decentralized simulation station is further for, upon receiving the coordinates of the virtual impact, computing the at least one newly formed 3D polygon mesh from the received coordinates, wherein computing at the second decentralized simulation station is performed at runtime independently from the first decentralized simulation station.

14. The system for updating damaged-enhanced 3D polygon meshes of claim 13, wherein the first decentralized simulation station further loads the at least one newly formed 3D polygon mesh, computed by the centralized processing unit, from the storage module when the at least one newly formed 3D polygon mesh reenters the first field of view.

15. The system for updating damaged-enhanced 3D polygon meshes of claim 11, wherein the centralized processing unit persistently updated the storage module by further:
storing at least one event in a database of the storage module corresponding to completion of the computation of the at least one newly formed 3D polygon mesh by the centralized processing unit.

16. The system for updating damaged-enhanced 3D polygon meshes of claim 10, wherein:
the first decentralized simulation station is associated to a first simulated vehicle of the computer generated environment, wherein the first field of view of the first decentralized simulation station is defined from a user's position within the first simulated vehicle; and
the second decentralized simulation station is associated to a second simulated vehicle of the computer generated environment, wherein a second field of view of the second decentralized simulation station is defined from a user's position within the second simulated vehicle.

17. The system for updating damaged-enhanced 3D polygon meshes of claim 10, wherein when the content file is currently subject to an ongoing transaction, the centralized processing unit is further for:
waiting until the at least one transaction marker file indicates completion of the ongoing transaction;

creating a new start transaction marker file, a name of the new start transaction marker file reflecting a newer version compared to the name of the content file following the ongoing transaction;

updating the new content file with the at least one newly formed 3D polygon mesh, the name of the new content file reflecting the same version as the start transaction file; and creating a new end transaction marker file, a name of the end transaction marker file reflecting the same version as the start transaction marker file.

18. The system for updating damaged-enhanced 3D polygon meshes of claim 10, wherein the centralized processing unit is further for:

after receiving the coordinates of the virtual impact and before persistently updating the storage module, receiving coordinates of a second virtual impact on the 3D polygon mesh;

before copying the content file into the new content file on the file system, creating a first start transaction marker file of the at least one transaction marker file, a name of the first start transaction marker file reflecting a first new version compared to the latest version;

wherein copying the content file into the new content file on the file system and updating the new content file is performed by further creating a first new content file with the at least one newly formed 3D polygon mesh computed from the virtual impact, the name the first new content file reflecting the first new version;

wherein updating the at least one transaction marker file is performed by further creating a first end transaction marker file of the at least one transaction marker file, a name of the first end transaction marker file reflecting the same version as the first start transaction marker file;

following creating the first end transaction marker file, creating a second start transaction marker file of the at least one transaction marker file, a name of the second start transaction marker file reflecting a second new version compared to the first new version;

creating a second new content file with the at least one newly formed 3D polygon mesh computed from the second virtual impact, the name the second new content file reflecting the second new version; and creating a second end transaction marker file of the at least one transaction marker file, a name of the second end transaction marker file reflecting the same version as the second start transaction marker file.

* * * * *